(12) United States Patent
Cohen et al.

(10) Patent No.: US 12,204,181 B2
(45) Date of Patent: Jan. 21, 2025

(54) RESPONSE SHAPING BY MULTIPLE INJECTION IN A RING-TYPE STRUCTURE

(71) Applicant: Ramot at Tel-Aviv University Ltd., Tel-Aviv (IL)

(72) Inventors: Roei Aviram Cohen, Tel-Aviv (IL); Ofer Amrani, Tel-Aviv (IL); Shlomo Ruschin, Tel-Aviv (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 246 days.

(21) Appl. No.: 17/668,506

(22) Filed: Feb. 10, 2022

(65) Prior Publication Data
US 2022/0229316 A1 Jul. 21, 2022

Related U.S. Application Data

(63) Continuation of application No. PCT/IL2020/050901, filed on Aug. 16, 2020, which
(Continued)

(51) Int. Cl.
*H01S 5/10* (2021.01)
*G02F 1/01* (2006.01)
(Continued)

(52) U.S. Cl.
CPC ............ *G02F 1/011* (2013.01); *G02F 1/2257* (2013.01); *H01S 5/1003* (2013.01);
(Continued)

(58) Field of Classification Search
CPC .... G02F 1/011; G02F 2203/15; G02F 1/2257; G02F 1/313; G02F 2203/055;
(Continued)

(56) References Cited

U.S. PATENT DOCUMENTS 7,751,658 B2    7/2010  Welch et al.
11,101,620 B2 *  8/2021  Cohen .................. H01S 5/1003
(Continued)

FOREIGN PATENT DOCUMENTS

WO    WO 2021/033181    2/2021

OTHER PUBLICATIONS

Cohen et al. "Parameters-Insensitive Modulator for Optical Interconnect Systems Based on Double Injection", 2019 IEEE Optical Interconnects Conference (OI), Apr. 24, 2019 (2 pages).
(Continued)

*Primary Examiner* — Xinning(Tom) Niu

(57) ABSTRACT

Structures for response shaping in frequency and time domain, include an optical response shaper and/or a modulator device with multiple injection. The device comprises a resonator having an enclosed geometric structure, for example a ring or racetrack structure, at least two injecting optical waveguides approaching the resonator to define at least two coupling regions between the resonator and the injecting waveguides, and may define at least two Free Spectral Range states. One or both of the coupling regions has a coupling coefficient selected for a predetermined frequency or time response, and the coupling coefficient or other device parameters may be variable, in some case in real time to render the response programmably variable. In addition, the injection power at one of the optical waveguides serves to modify the response.

22 Claims, 36 Drawing Sheets
(20 of 36 Drawing Sheet(s) Filed in Color)

Related U.S. Application Data is a continuation-in-part of application No. 16/542,340, filed on Aug. 16, 2019, now Pat. No. 11,101,620.

(60) Provisional application No. 62/764,780, filed on Aug. 16, 2018.

(51) Int. Cl.
| | | |
|---|---|---|
| *G02F 1/225* | (2006.01) | |
| *H01S 5/12* | (2021.01) | |
| *H01S 5/06* | (2006.01) | |

(52) U.S. Cl.
CPC ............ *H01S 5/1028* (2013.01); *H01S 5/124* (2013.01); *G02F 2203/055* (2013.01); *H01S 5/0608* (2013.01)

(58) Field of Classification Search
CPC ............ G02F 2203/585; H01S 5/1003; H01S 5/1028; H01S 5/124; H01S 5/0608
See application file for complete search history.

(56) References Cited

U.S. PATENT DOCUMENTS

| | | | | |
|---|---|---|---|---|
| 11,677,215 | B2 * | 6/2023 | Cohen ................... | G02F 1/2257 372/44.01 |
| 2004/0161188 | A1 * | 8/2004 | Su ...................... | G02B 6/29338 385/24 |
| 2005/0196103 | A1 * | 9/2005 | Kaplan ............. | G02B 6/12007 385/39 |
| 2005/0286602 | A1 | 12/2005 | Gunn | |
| 2006/0078254 | A1 | 4/2006 | Djordjev et al. | |
| 2008/0123701 | A1 * | 5/2008 | He ........................ | H01S 5/1032 372/44.01 |
| 2009/0046748 | A1 * | 2/2009 | Kato ....................... | H01S 5/026 372/20 |
| 2009/0122817 | A1 | 5/2009 | Sato et al. | |
| 2009/0208162 | A1 | 8/2009 | Yap | |
| 2011/0085572 | A1 | 4/2011 | Dallesasse et al. | |
| 2015/0215043 | A1 | 7/2015 | Debregeas | |
| 2018/0143461 | A1 * | 5/2018 | Zheng .................... | H01S 5/125 |
| 2019/0004340 | A1 | 1/2019 | Al. | |
| 2020/0059068 | A1 | 2/2020 | Cohen et al. | |
| 2021/0384704 | A1 | 12/2021 | Cohen et al. | |

OTHER PUBLICATIONS

Cohen et al. "Response Shaping With a Silicon Ring Resonator Via Double Injection", Nature Photonics, 12(11): 706-712, Oct. 26, 2018.

Dong "Double Injection Resonator", Microphotonics, 12(11): 642-644, Oct. 26, 2018.

Official Action Dated Sep. 9, 2022 from the US Patent and Trademark Office Re. U.S. Appl. No. 17/408,592. (22 pag.

International Search Report and the Written Opinion Dated Nov. 10, 2020 From the International Searching Authority Re. Application No. PCT/IL2020/050901. (10 Pages).

Notice of Allowance Dated Apr. 19, 2021 from the US Patent and Trademark Office Re. U.S. Appl. No. 16/542,340. (7 pages).

Official Action Dated Aug. 27, 2020 from the US Patent and Trademark Office Re. U.S. Appl. No. 16/542,340. (12 pages).

\* cited by examiner

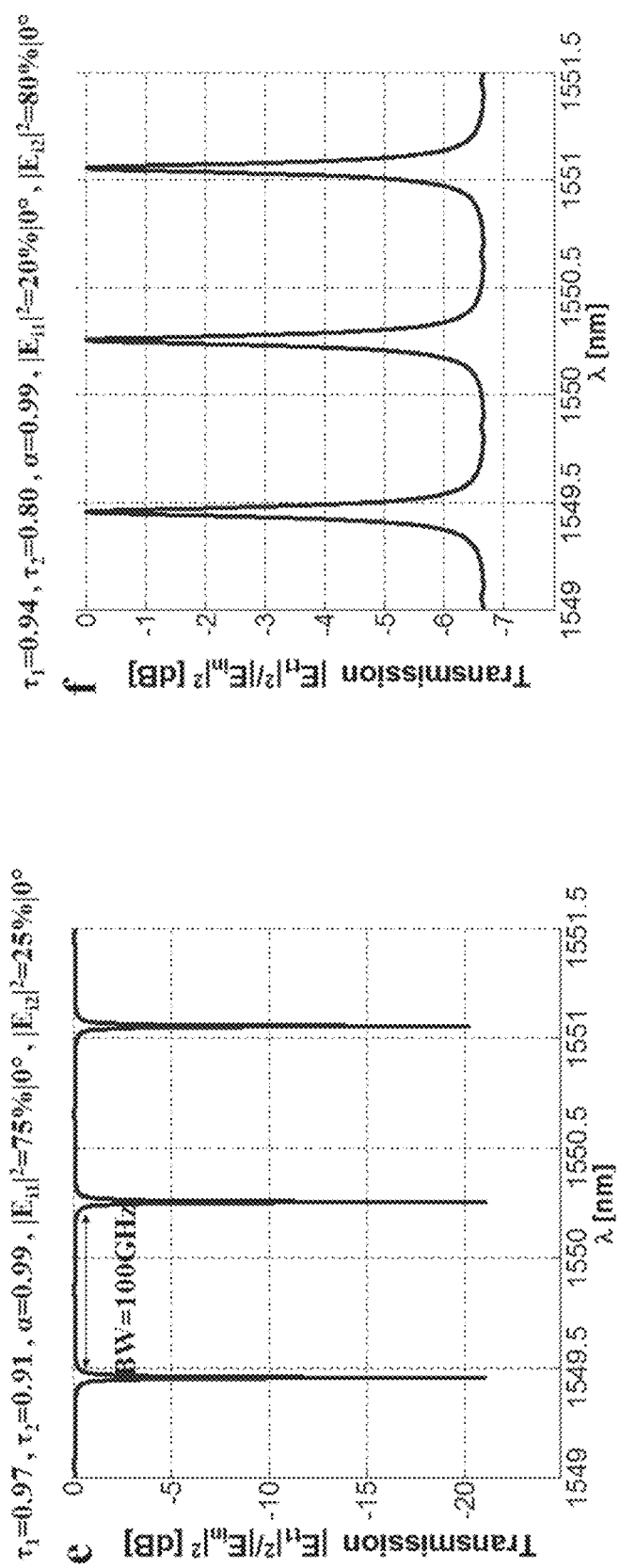

RESPONSE SHAPING BY MULTIPLE INJECTION IN A RING-TYPE STRUCTURE

RELATED APPLICATION(S)

This application is a Continuation of PCT Patent Application No. PCT/IL2020/050901 having International filing date of Aug. 16, 2020, which is a Continuation-in-Part (CIP) of U.S. patent application Ser. No. 16/542,340 filed on Aug. 16, 2019, now U.S. Pat. No. 11,101,620, which claims the benefit of priority under 35 USC § 119(e) of U.S. Provisional Patent Application No. 62/764,780 filed on Aug. 16, 2018. The contents of the above applications are all incorporated by reference as if fully set forth herein in their entirety.

FIELD AND BACKGROUND OF THE INVENTION

The present invention, in some embodiments thereof, relates to a ring-type resonator using double or multiple optical signal injection ports or coupling regions.

As the field of integrated optics expands, small size silicon-based modulators and filters have been studied and demonstrated, consequently motivating further exploration at both the transmitter and receiver sides. In many applications, specific frequency, or electrical responses are desired. In Radio Frequency (RF) applications, linear transmission is typically required in order to provide a large Spur-Free Dynamic Range (SFDR). Detecting digitally modulated optical signals requires an optical comparator that can be realized by a device having a square wave shape. A square-like behavior, this time in the frequency domain, is also encountered when considering a bandpass box-like filter in high capacity optical links such as Wavelength-Division Multiplexing (WDM). WDM-based devices are used in Dense WDM (DWDM) systems via multiplexing/de-multiplexing odd and even channels by employing a so-called interleaver filter. The separation of channels, obtained by the interleaved shaped waveform, is also needed to facilitate traffic routing within a relay station.

Response shapes, being output waveforms in both frequency and time domain, are commonly realized by complex optical circuits often comprising several optical elements. In the case of analog RF applications, a chain of Mach-Zehnder Interferometers (MZI) was required to obtain high SFDR; Ring-Assisted MZI (RAMZI) with multiple electrodes have also been widely explored. Several complex designs were suggested for detecting digitally modulated optical signals by using an optical comparator. These designs require multiple electrodes and large footprint. To obtain a sharp box-like filter response, five cascaded rings were devised while several rings coupled to a MZI were reported. For an interleaver, a flat-top spectral response is required or otherwise the transmission efficiency will be sensitive to a slight shift in wavelength (e.g. laser quality, temperature). Consequently, the sinusoidal response of a single unbalanced cross-bar MZI is not adequate. This motivated the analysis of circuits comprising MZIs in a serial configuration made of directional couplers (DC) or Multimode Interferometers (MMI) elements to obtain a flat-top response. An interleaver for Nyquist-WDM (superchannel) based on RAMZI circuits with additional coupled rings has recently been demonstrated. The abovementioned solutions exhibit similar characteristics such as large footprint, fabrication sensitivity and multiplicity of electrodes.

Large Free Spectral Range (FSR) is required for various circumstances. These include some sensing applications, tunable filters, and WDM architecture where large FSR is required to encompass a large frequency range or avoid cross-talk among channels. FSR increase is typically achieved by reducing the resonator length, however, this also reduces the electrode length, consequently increasing the required operating voltage. Small size optical structures, such as photonic crystals and rather complex ring resonator-based designs, have been suggested to increase the FSR and may, in theory, be able to operate under low voltage. These, however, are more complicated to fabricate and harder to integrate with an electrical control.

Optical circuits based on ring resonators are very sensitive to fabrication deviations. A small variation in the coupling or loss coefficients may drastically decrease the Extinction Ratio (ER) of the transmission. A 3D Finite Difference (FDTD) sensitivity analysis showed that for about 20 nm (i.e. 5% in silicon) deviation in waveguide width, the power coupling ratio can vary by more than 20%; while the general shape of the transmission is preserved, the ER then decreases by more than 15 dB. Such deviations significantly impact large circuits with more than one optical element, and may burden the yield in mass production. A less sensitive device is the MZI. However, due to power splitting variances, undersigned variations in length (imbalance) between its arms, and width deviations, the MZI cannot provide infinite ER, but typically yields 15-30 dB of extinction.

In a recent publication, a racetrack-shaped ring resonator augmented by a Double Injection (DI) configuration was presented. It was aimed at providing a modulator having finer linear voltage-transmission response, and this was achieved by placing an electrode over the racetrack. The device is herein abbreviated FLAME.

SUMMARY OF THE INVENTION

The present embodiments are based on coupling optical fields into ring-type structures at two or more ports and/or two or more coupling locations, where it was discovered that the FLAME device as disclosed in the background allows response shaping of the output signal in a variety of waveforms both in frequency and time domain. In embodiments, the response shaping is programmable. Response shaping may be attained by determining the value of the coupling coefficients or of various parameters of the waveguides via a diversity of mechanisms, including static and dynamic mechanisms.

According to an aspect of some embodiments of the present invention there is provided an optical response shaper and/or a modulator device with multiple injection, the device comprising:
  a resonator having an enclosed geometric structure;
  a first injection optical waveguide and at least one further injection optical waveguides, each of the optical waveguides comprising an input port and a second end, the optical waveguides passing the resonator at respective approach points;
  coupling regions between the resonator and the injecting waveguides at the approach points respectively, the coupling regions providing optical coupling between the resonator and the injecting waveguides; and
  an output port at a second end of the first injection optical waveguide configured to provide a plurality of shapes of frequency or time or phase or intensity responses according to parameters of the injecting waveguides or of the coupling regions and further according to a power of an optical control signal injected at the at least one further optical waveguide.

In an embodiment, parameters of the coupling regions or the waveguides may define at least two Free Spectral Range states, a first, regular, state and at least one additional, larger period state.

In an embodiment, at least one of the two coupling regions is configured with a coupling coefficient selected for the predetermined frequency or time or phase response.

Embodiments may comprise at least one electrode placed at the vicinity of at least one of the waveguides, the additional electrode being for programmatically altering a respective coupling coefficient to vary the predetermined frequency response or time response or phase-response.

Embodiments may comprise an electrode over each coupling region respectively, thereby to alter coupling coefficients at each coupling region.

Embodiments may comprise at least two input ports and at least two output ports and electrodes at each coupling region, the electrodes each being configured to separately vary a respective coupling coefficient, thereby to provide a programmable matrix function.

The device may be connected to at least three other similar or same devices to form a programmable optical matrix array.

In an embodiment, a length along a first of the injection waveguides from a respective input port to a respective coupling region is different from a length of a second of the injection waveguides from a respective input port to a respective coupling region.

In an embodiment, the enclosed geometric structure comprises a ring structure or a racetrack structure, or a disk structure or a Fabry-Perot type structure, or a photonic crystal-based structure, or a structure forming an optical resonator.

Embodiments may comprise a separately programmable electrode over each of the coupling regions respectively, the separately programmable electrode comprising one member of the group comprising a PN diode, PIN diode, MOS capacitor, a BJT transistor, an electrode that uses thermo-optic effect, and an electrode that uses the electro-optic effect, or an electrode that uses a plasmonic effect, or an electrode that uses a stress induced effect.

Devices according to the present embodiments may be connected with additional devices according to the present embodiments, to form an artificial neural network, wherein the separately programmable electrodes provide axons for network learning.

In an embodiment, the predetermined response is one member of the group consisting of sinusoidal, triangular, square, combined dips and peaks, spikes, an interleaver, a fano-spectrum shape and a Parameters-Insensitive-Response.

In an embodiment, the coupling coefficient is at least partly governed by a distance between the resonator and a respective waveguide or by the waveguides' width, at a respective coupling region.

Embodiments may provide a constellation of points for quadrature amplitude modulation (QAM).

Embodiments may provide one member of the group of modulations consisting of: Phase Shift Keying (PSK), Pulse Amplitude Modulation (PAM), Quadrature Amplitude Modulation (QAM) and Amplitude, FSR shaping and Phase Shift Keying (APSK).

In an embodiment, the time or frequency or phase response is affected by an optical input power.

A device of the present embodiments may be connected to at least three further devices according to the present embodiments, to form a multiple input multiple output programmable matrix.

Embodiments may include a field programmable optical array comprising optical devices according to the present embodiments connected together into a grid.

Embodiments may include a plurality of the device of any of the present embodiments, connected together in a grid.

According to a second aspect of the present invention there is provided an optical response shaper and/or a modulator device with multiple injection, the device comprising:
  a resonator having an enclosed geometric structure;
  at least two injection optical waveguides between an input port and a second end, the optical waveguides passing the resonator at respective approach points;
  coupling regions between the resonator and the injecting waveguides at the approach points respectively, the coupling regions providing optical coupling between the resonator and the injecting waveguides; and
  an output port at a second end of one of the injection optical waveguides for providing a plurality of shapes of frequency or time or phase or intensity responses according to parameters of the injecting waveguides or of the coupling regions, wherein the at least two injection optical waveguides are parallel to each other in a first, axial, direction in at least some of a region between the respective input ports and the coupling regions, the input ports being offset from each other in the first, axial, direction.

According to a third aspect of the present invention there is provided an optical response shaper and/or a modulator device with multiple injection, the device comprising:
  a resonator having an enclosed geometric structure;
  at least two injection optical waveguides between an input port and a second end, the optical waveguides passing the resonator at respective approach points;
  coupling regions between the resonator and the injecting waveguides at the approach points respectively, the coupling regions providing optical coupling between the resonator and the injecting waveguides;
  electrodes in proximity to each of the waveguides, and
  an output port at a second end of one of the injection optical waveguides, the device being configured to vary voltages at the electrodes respectively, thereby to provide variations in shapes or frequency or time or phase or intensity at the output.

In an embodiment, the electrodes in proximity to the waveguides are located at the coupling regions respectively.

In an embodiment, the electrodes are configured to vary the voltages to provide FSR shaping.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a simplified diagram showing an optical device according to a first embodiment of the present invention and showing coupling regions where coupling coefficients are set to provide predetermined responses;

Figure 1:
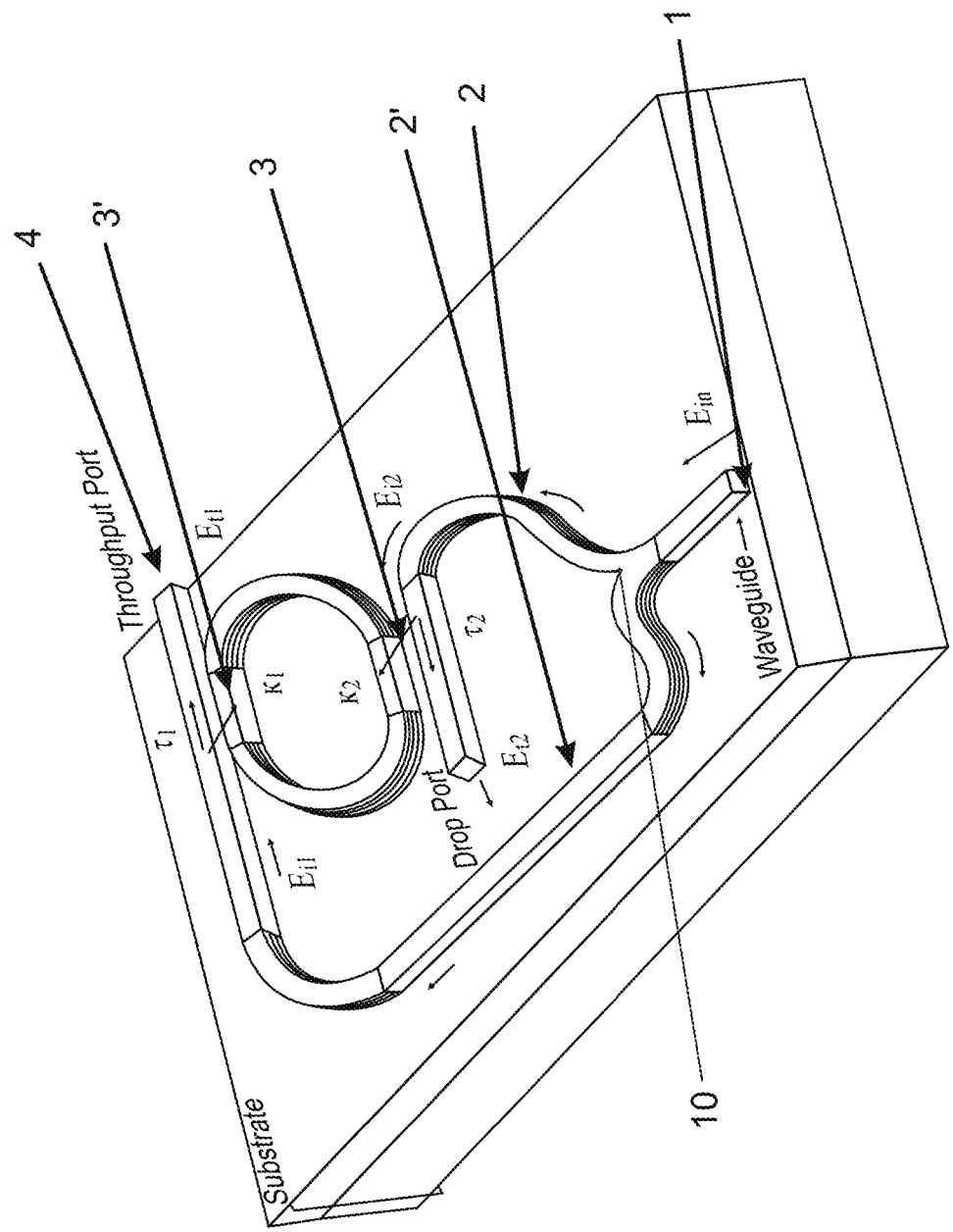
Figure 3A:
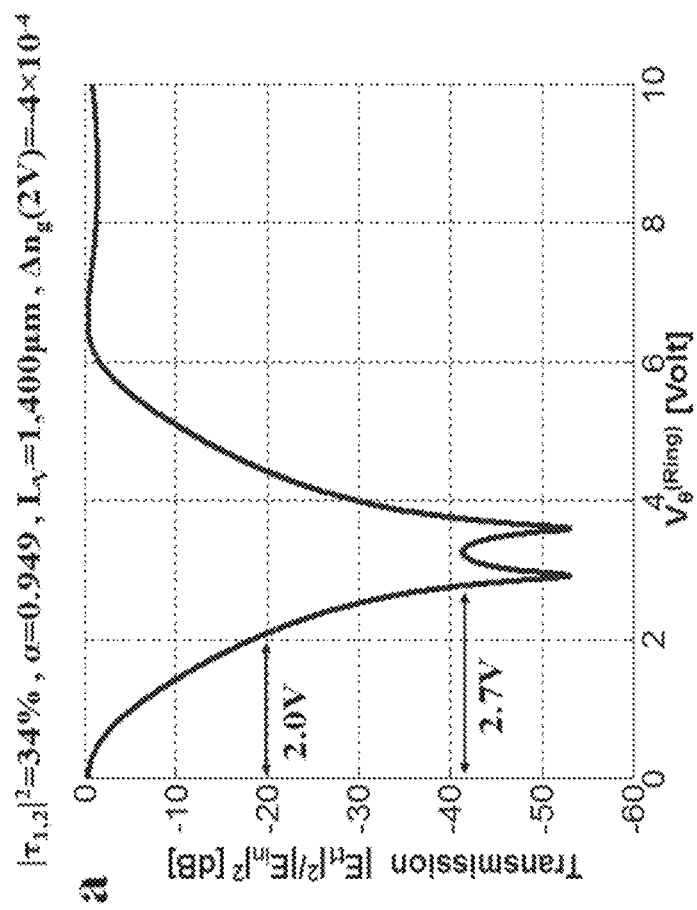
Figures 3B, 3C:
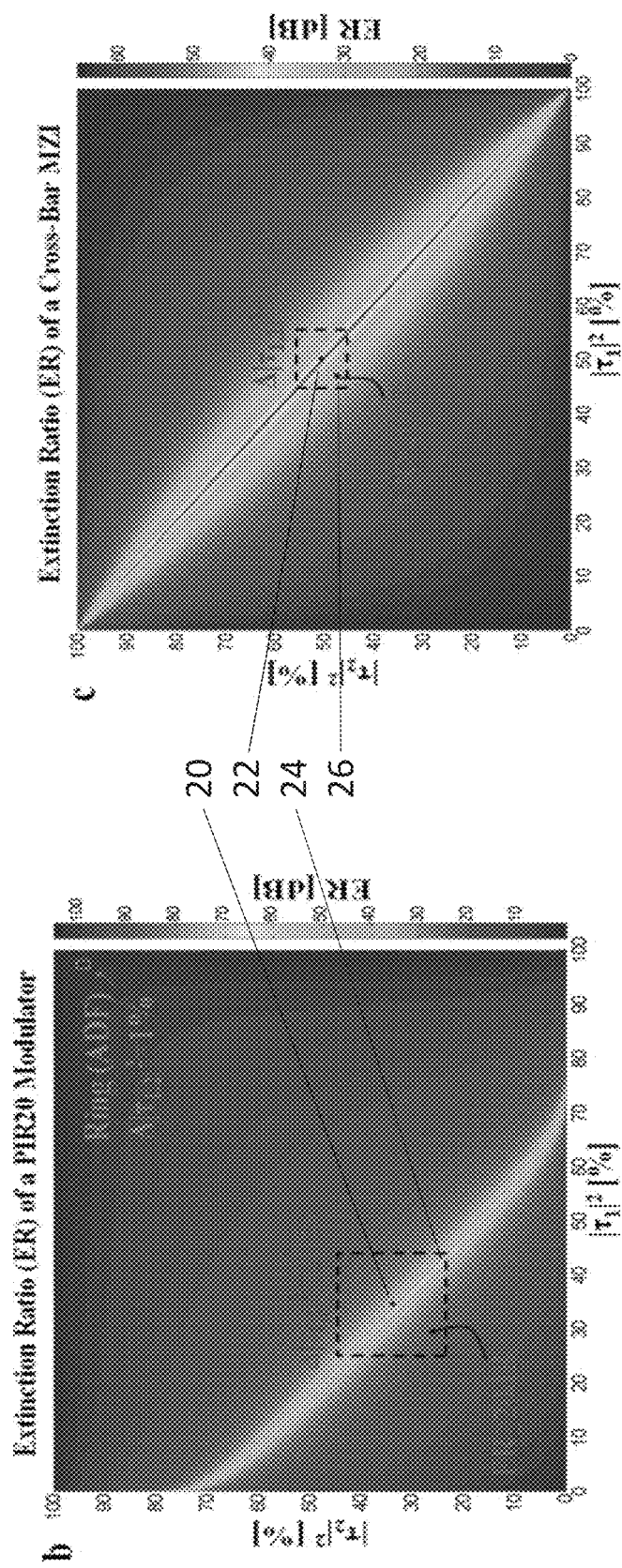
Figure 5B:
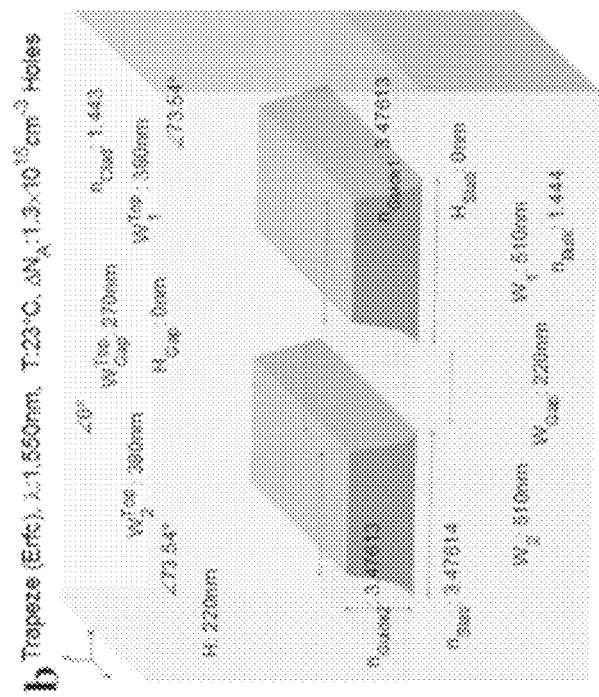
Figure 5A:
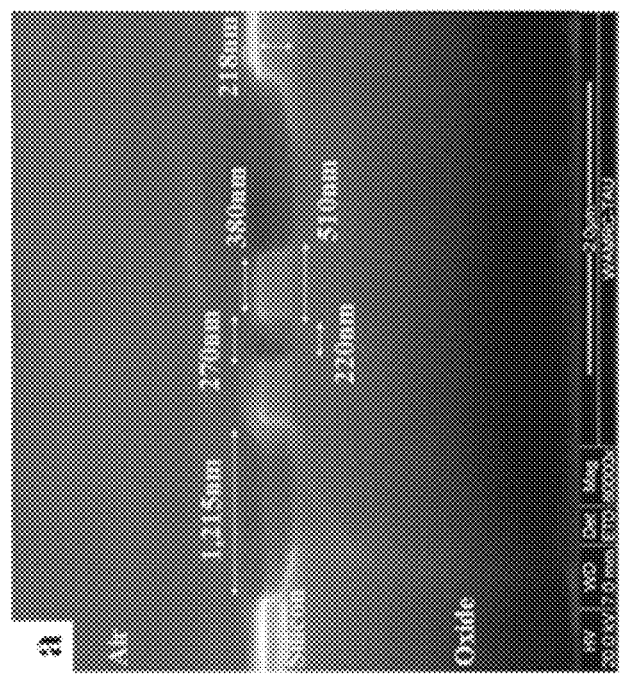
Figure 5D:
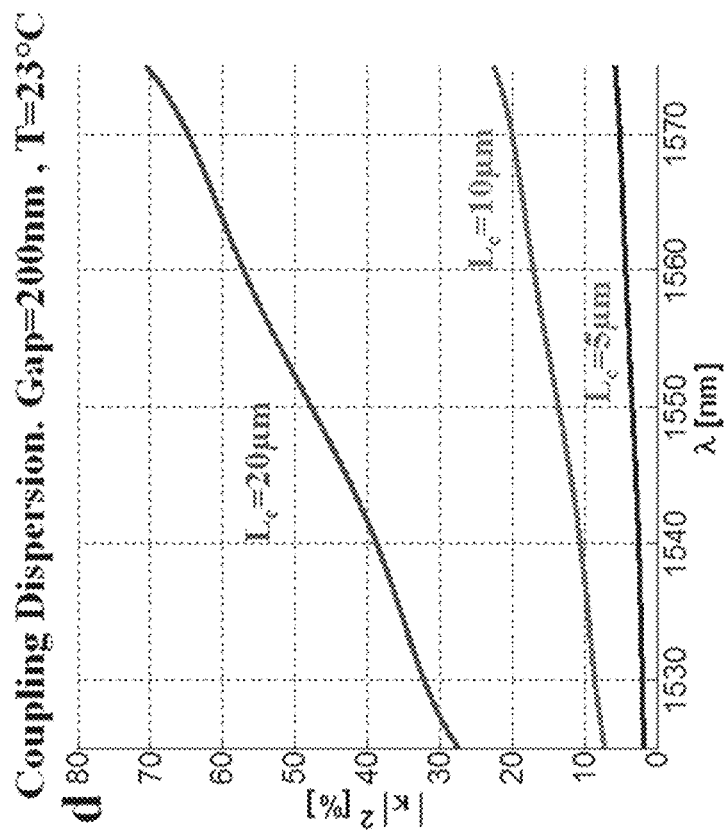
Figure 5C:
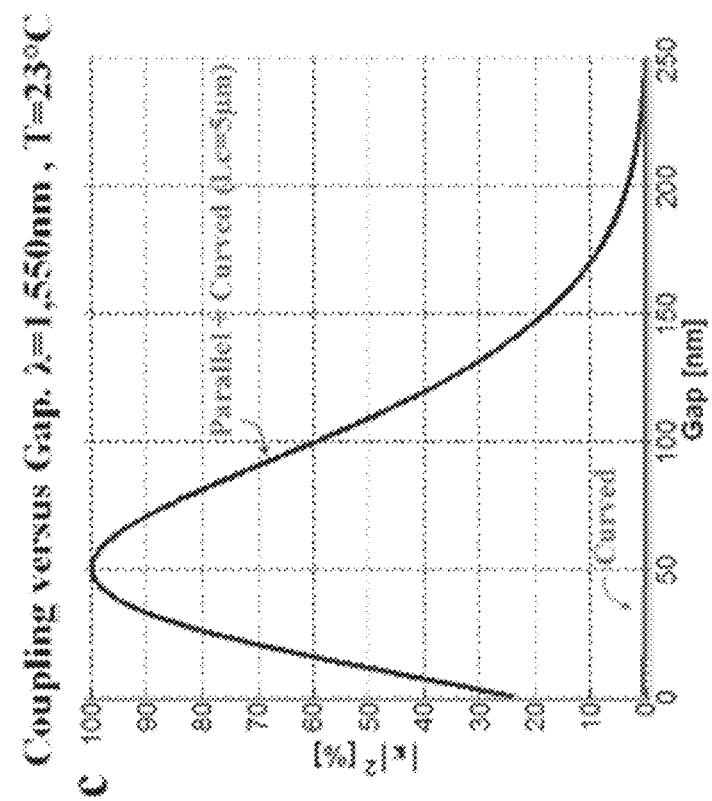
Figure 7:
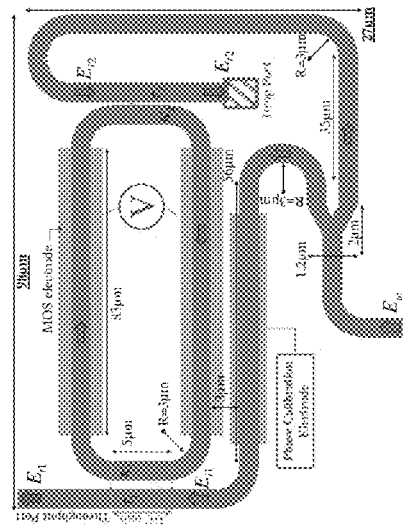
Figure 9:
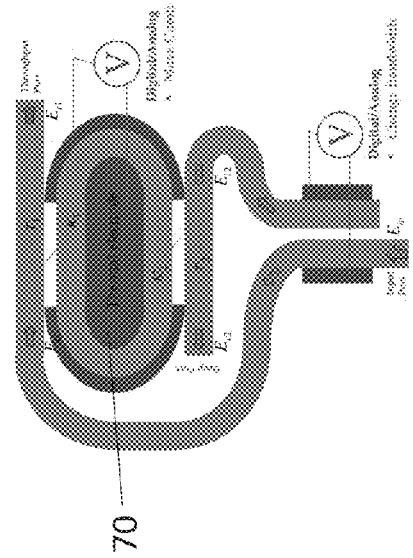
Figure 6:
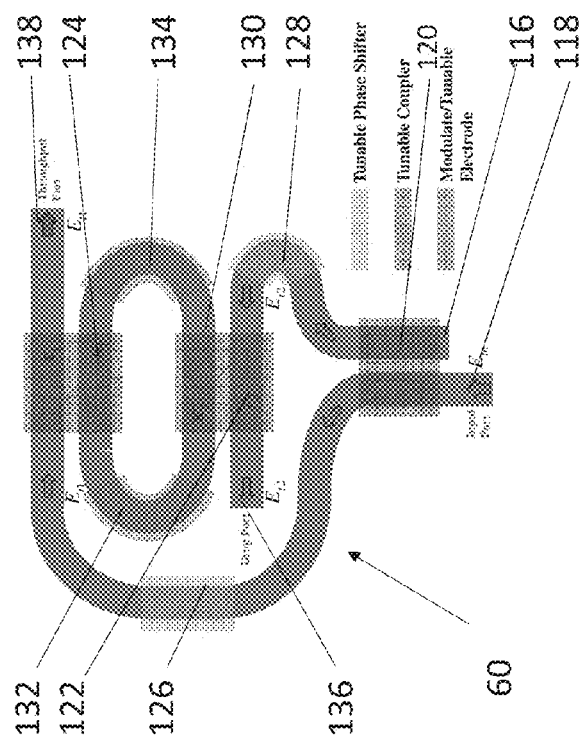
Figure 8:
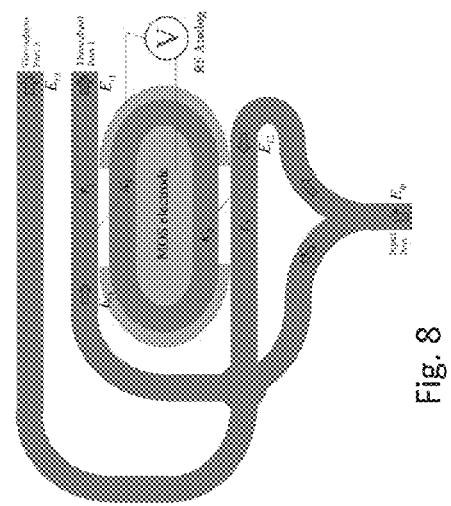
Figure 10B:
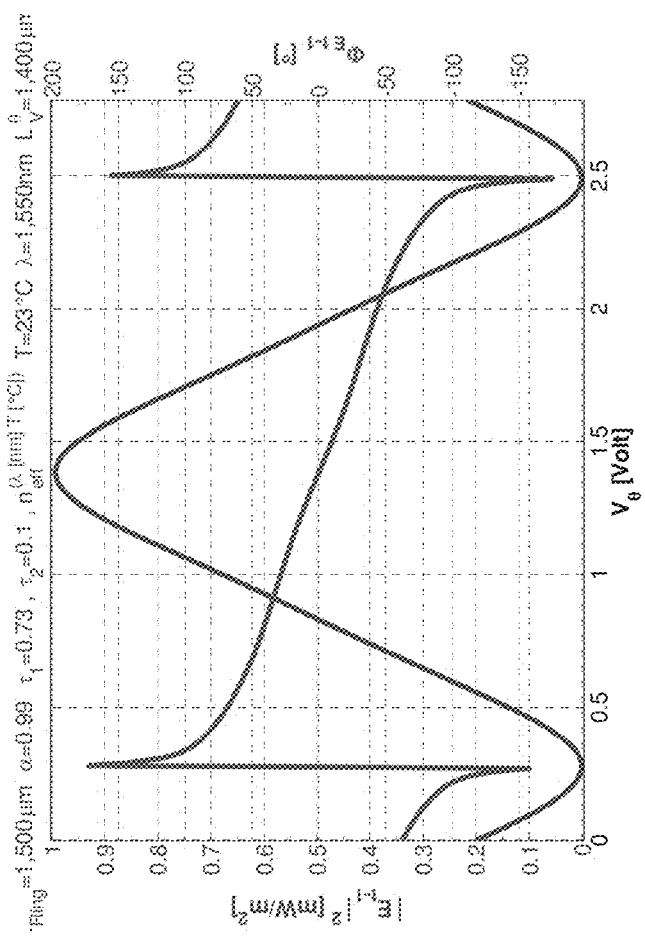
Figure 10A:
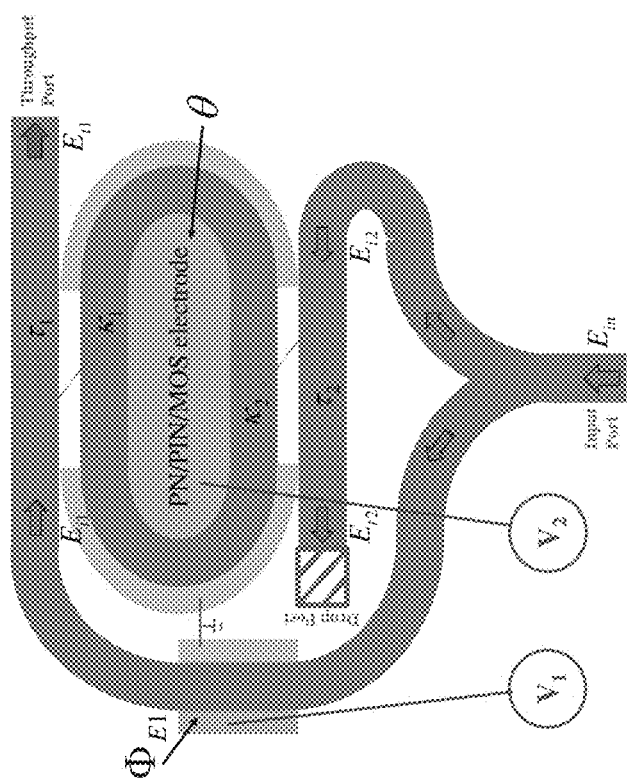
Figure 10C:
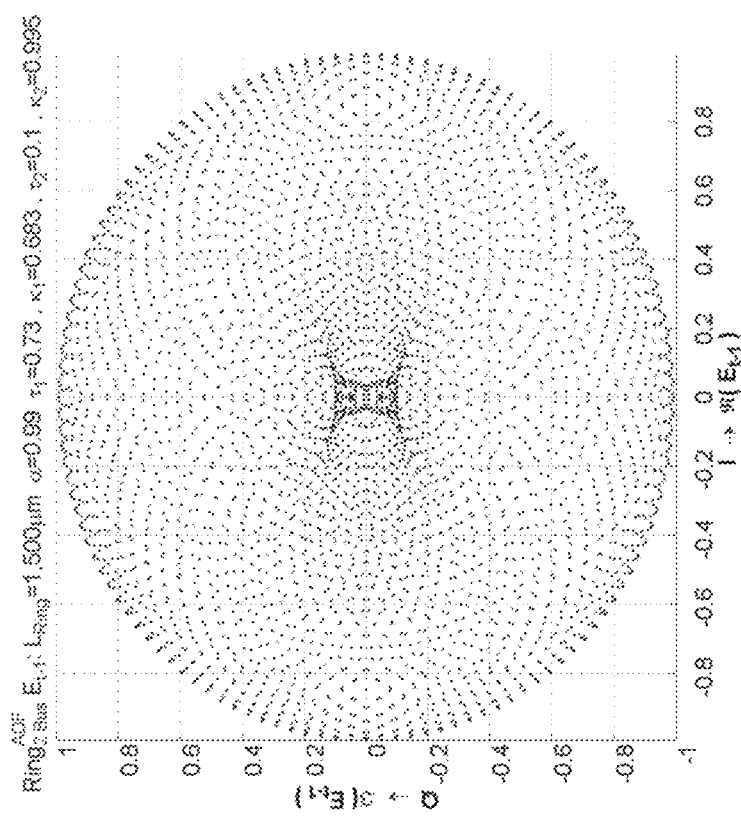
Figure 11:
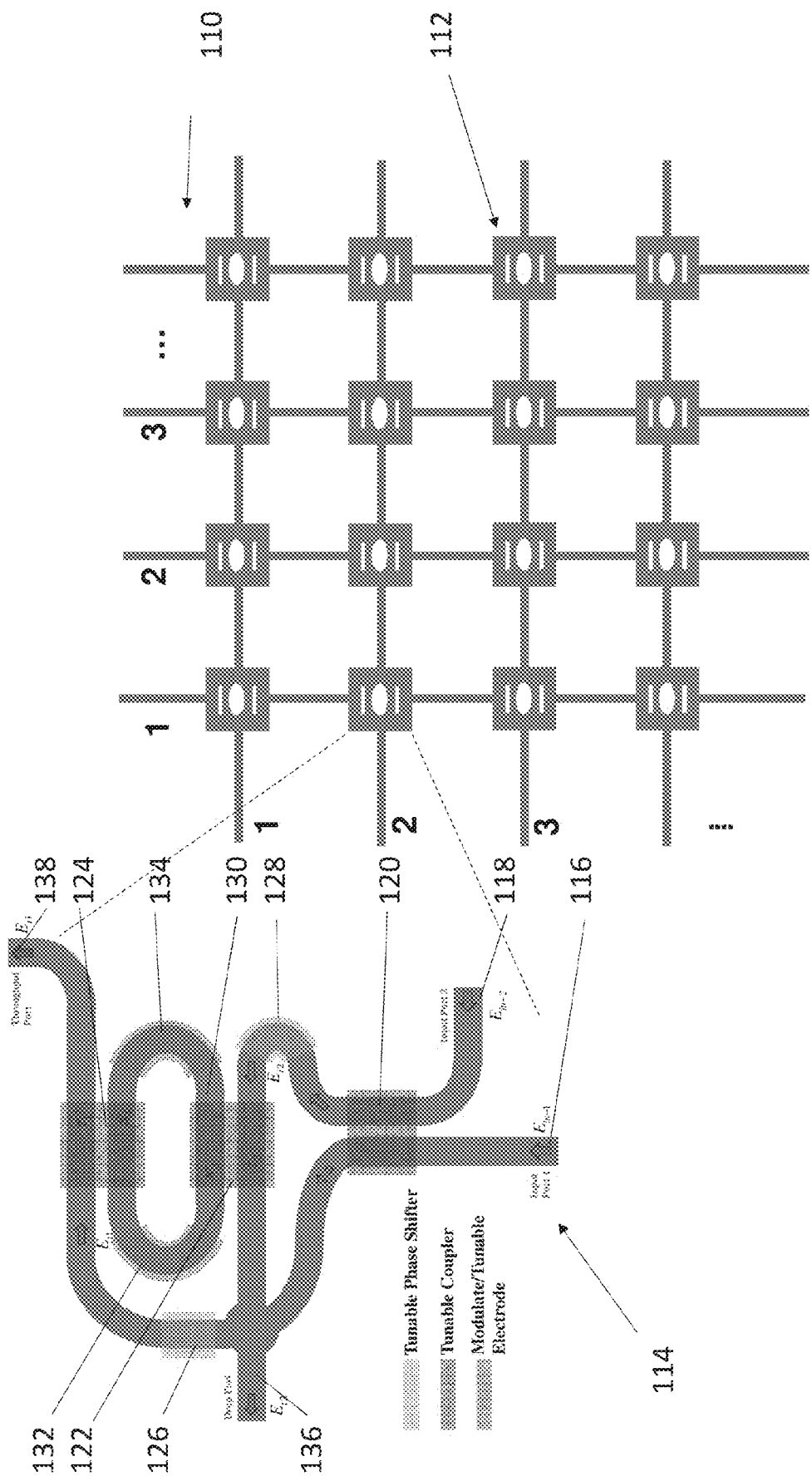
Figures 12, 13:
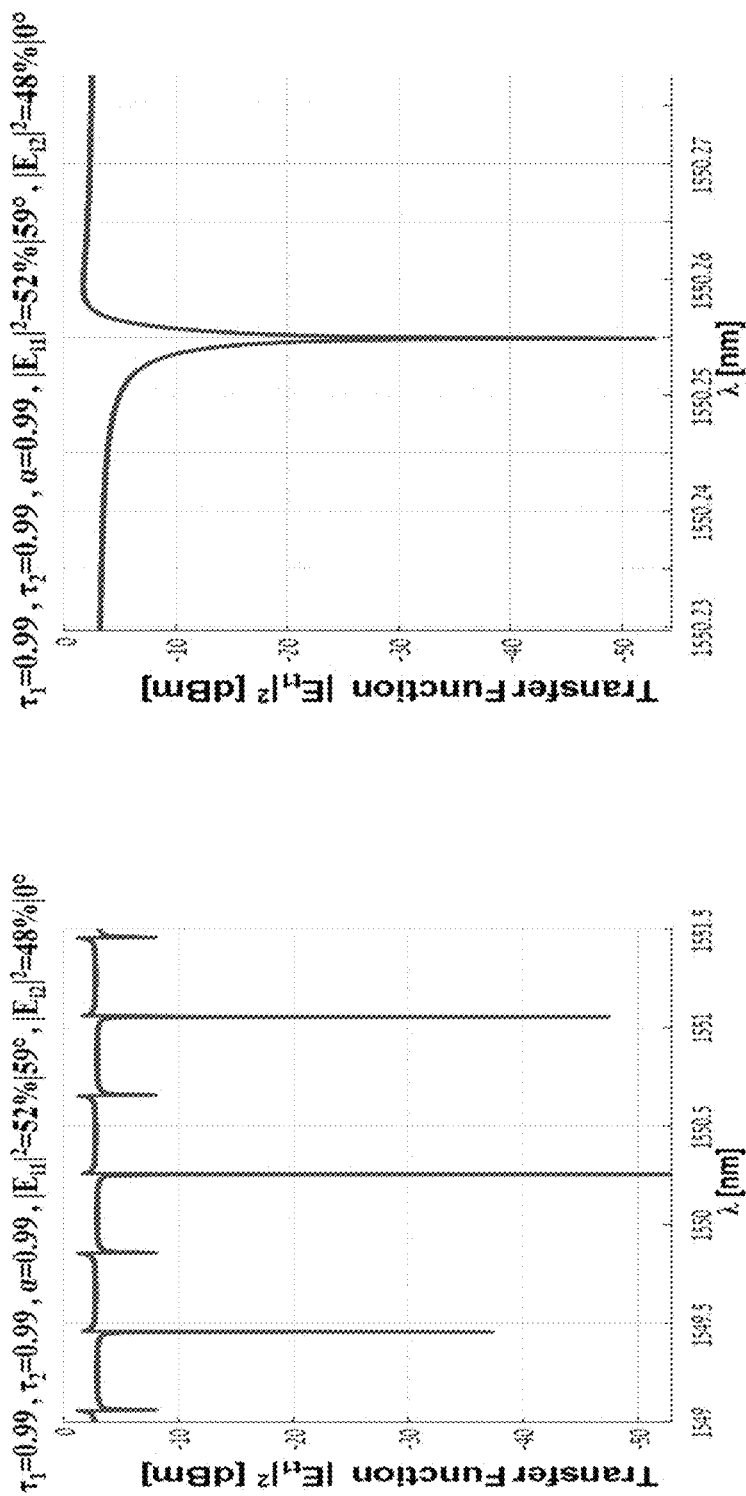
Figure 15:
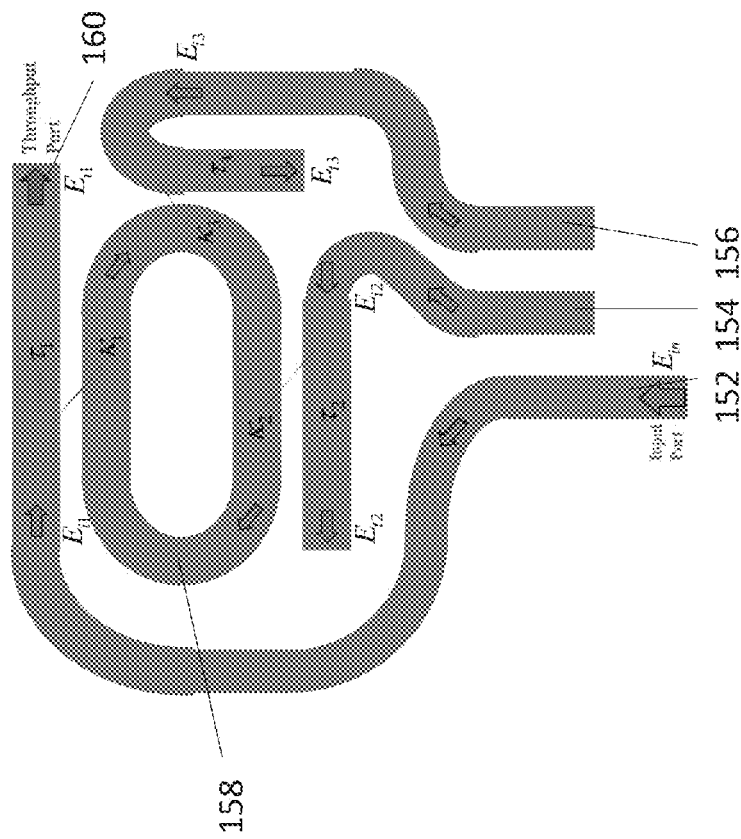
Figure 14:
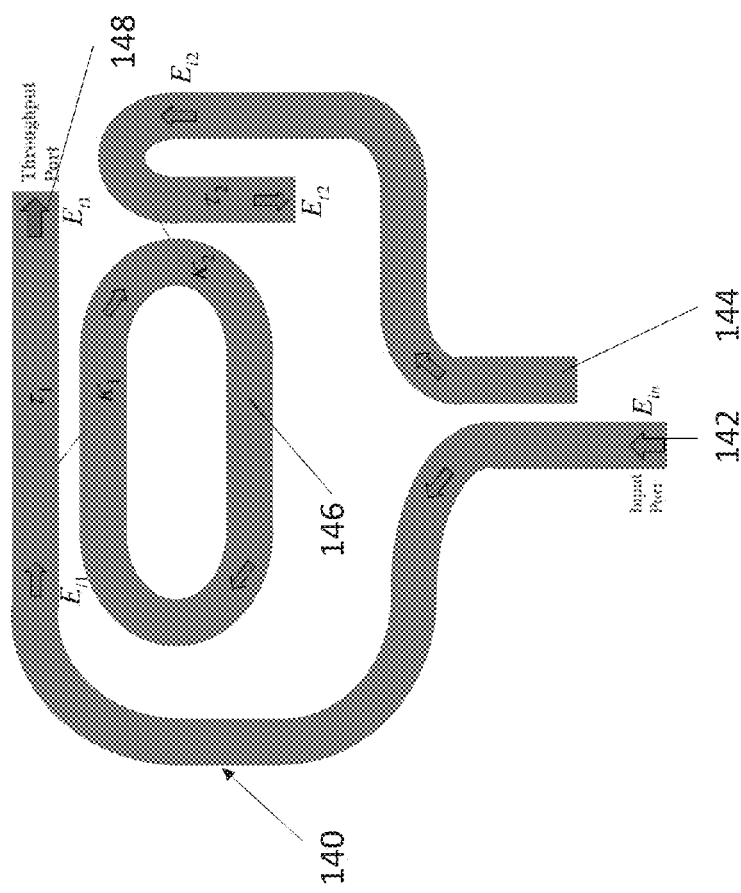
Figure 18A:
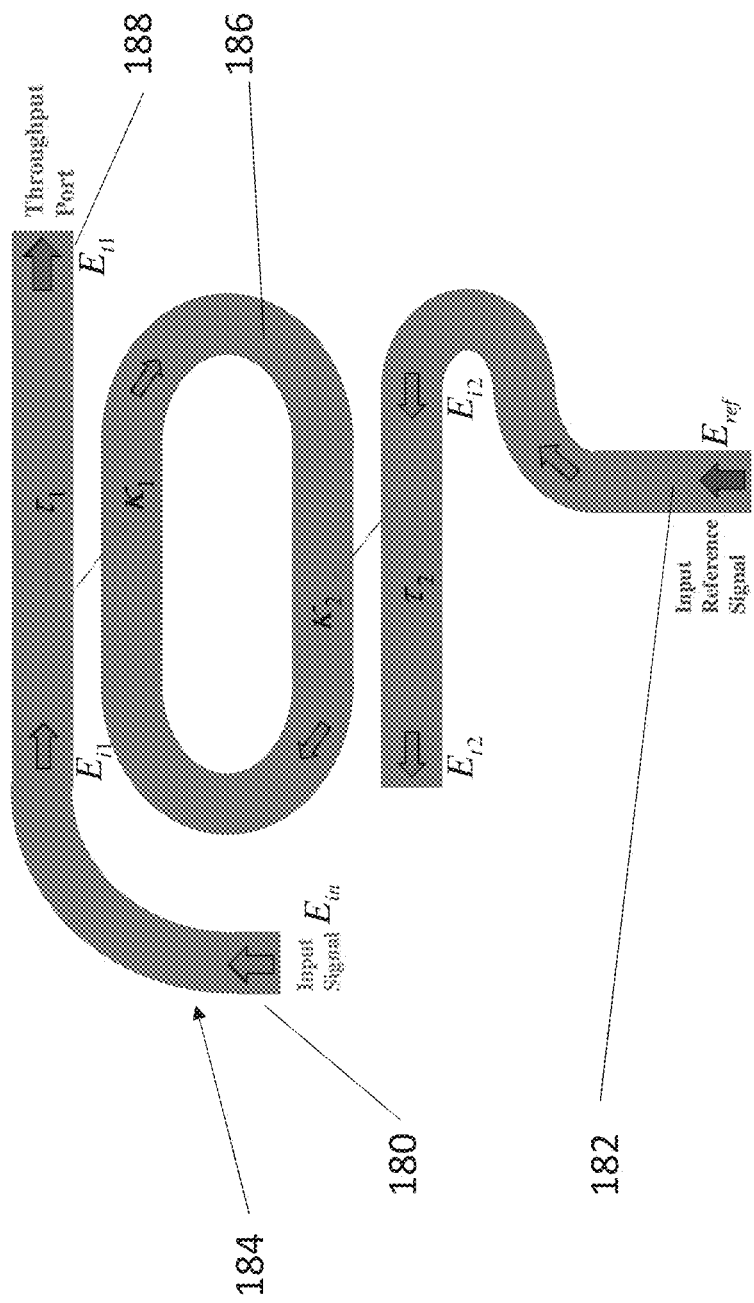
Figure 18C:
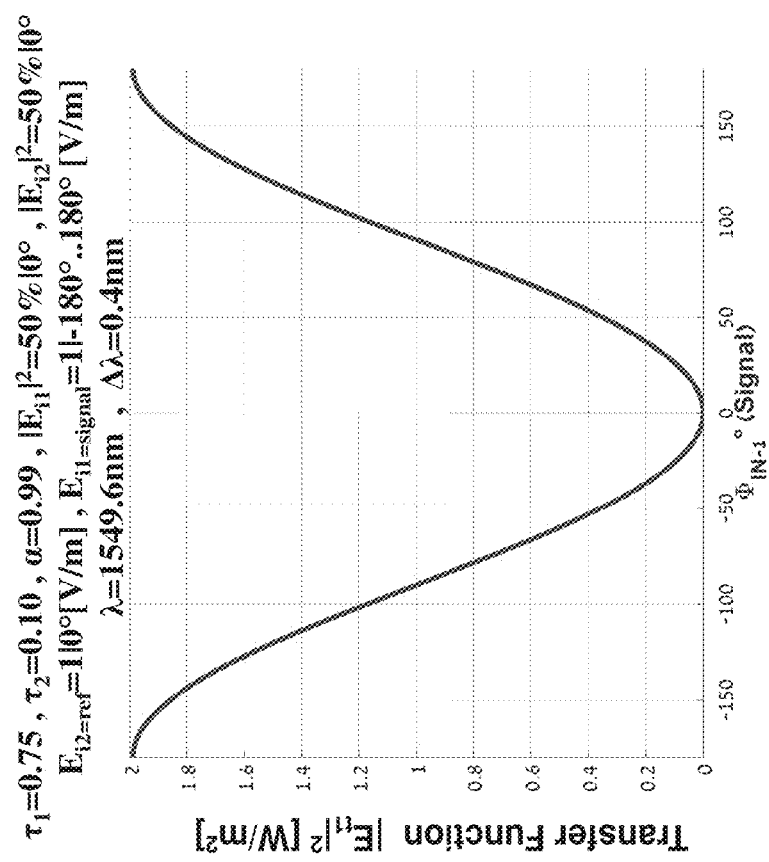
Figure 18B:
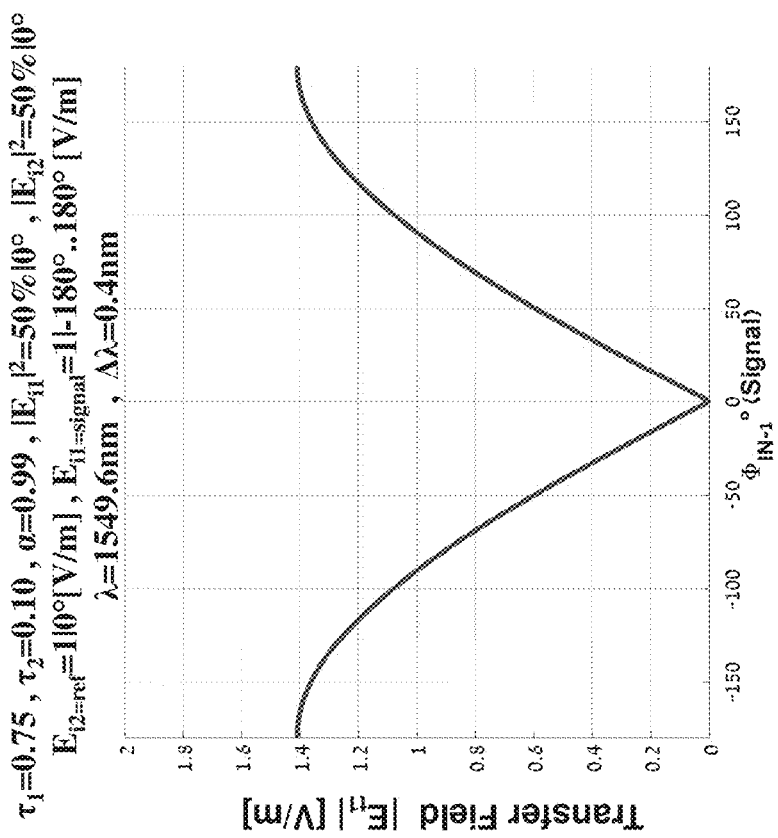
Figure 19B:
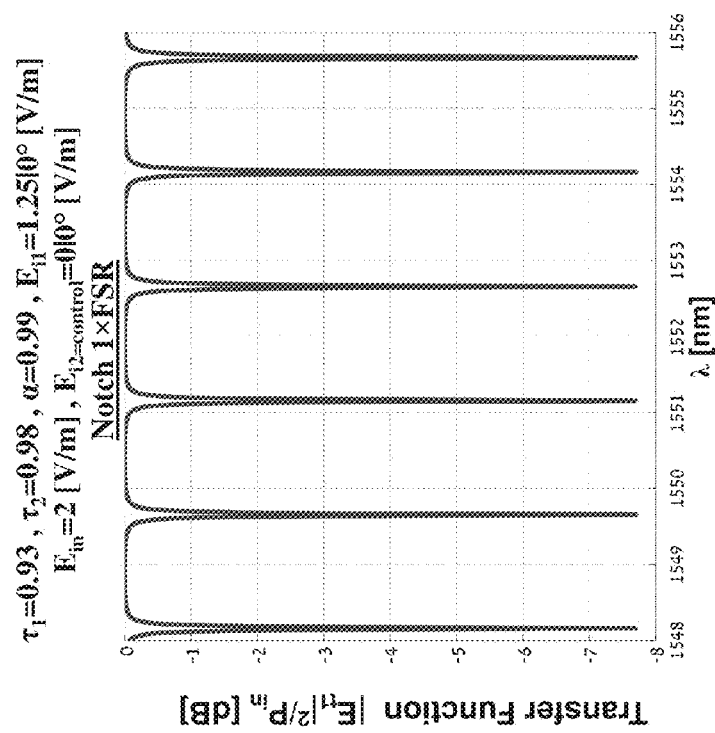
Figure 19A:
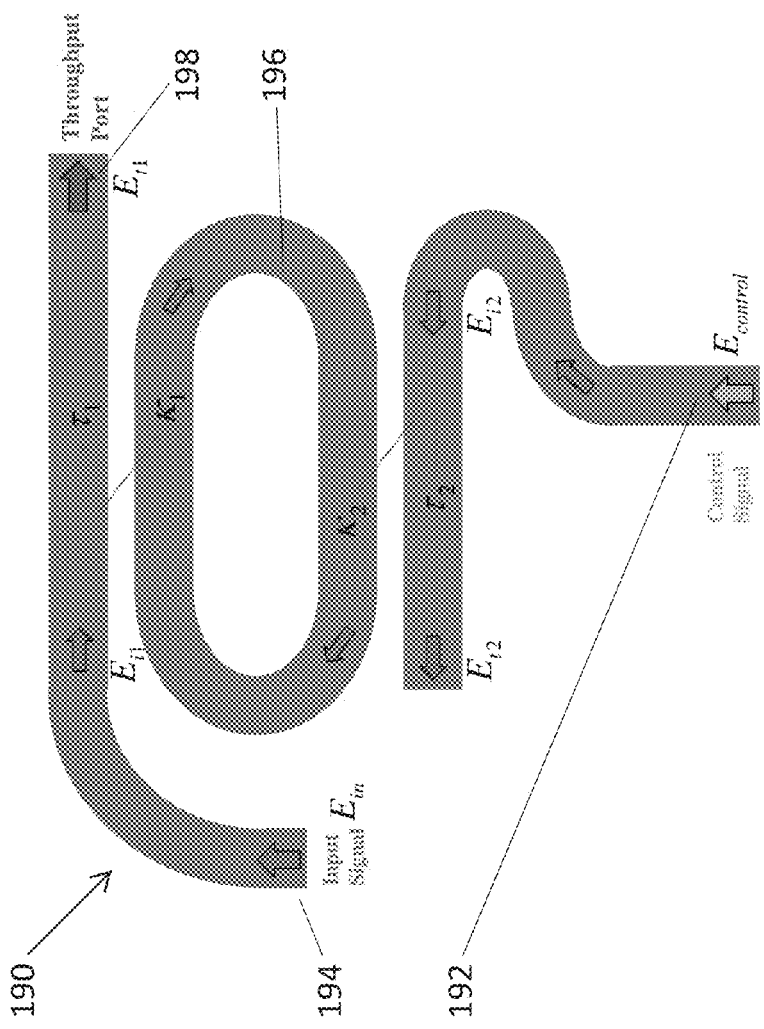
Figure 19D:
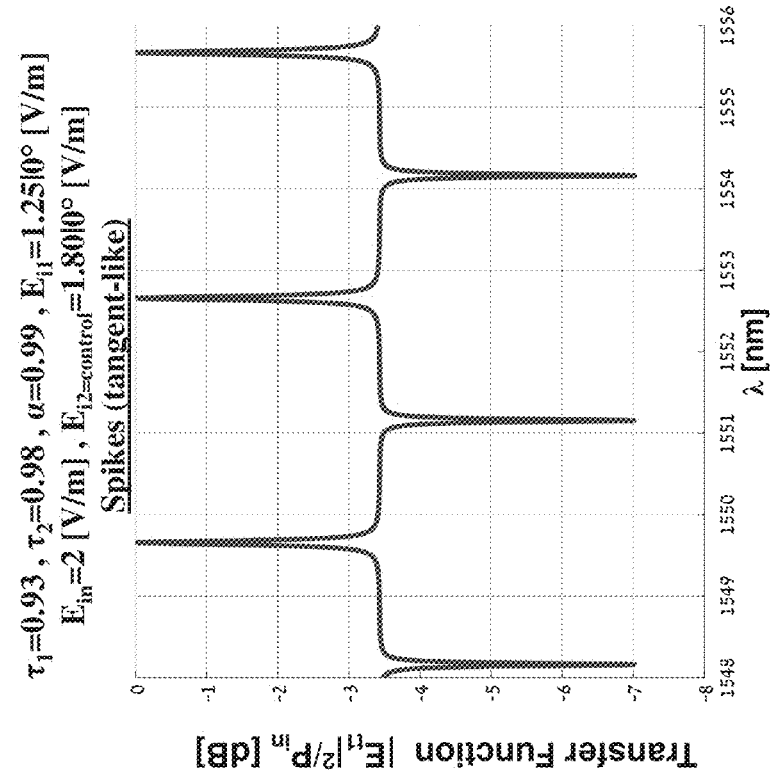
Figure 19C:
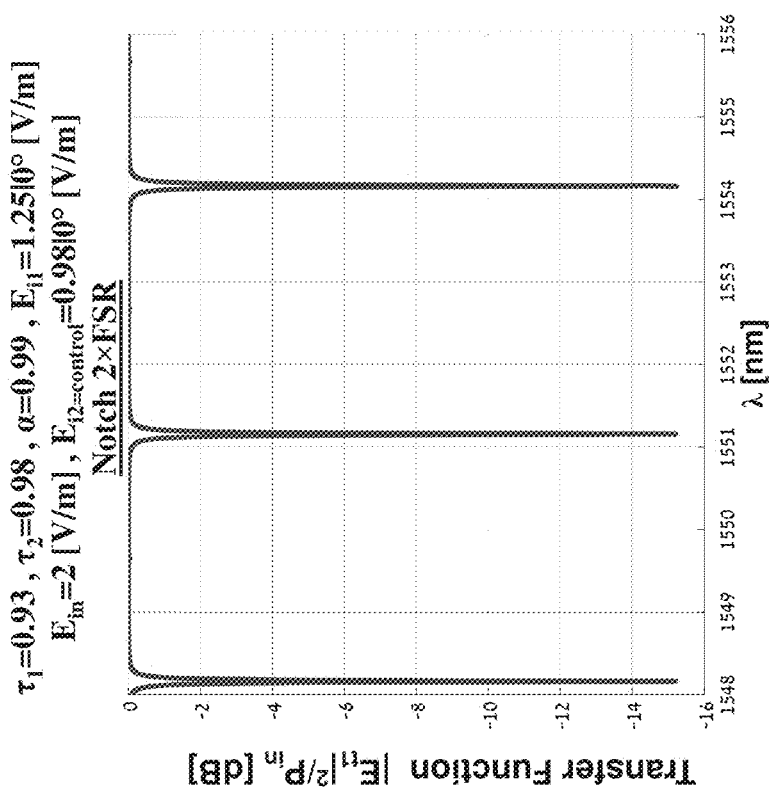
Figure 19F:
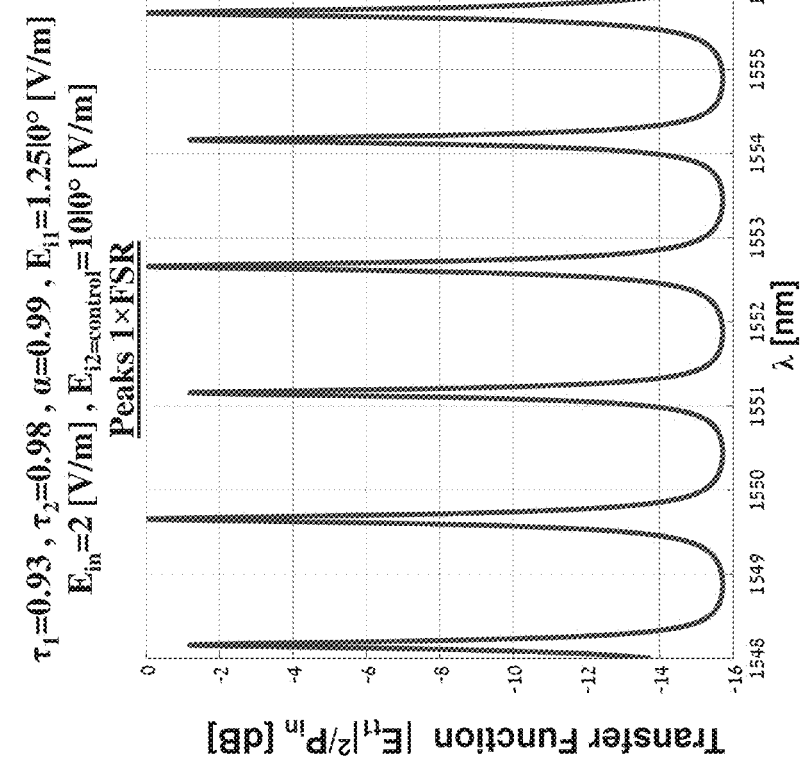
Figure 19E:
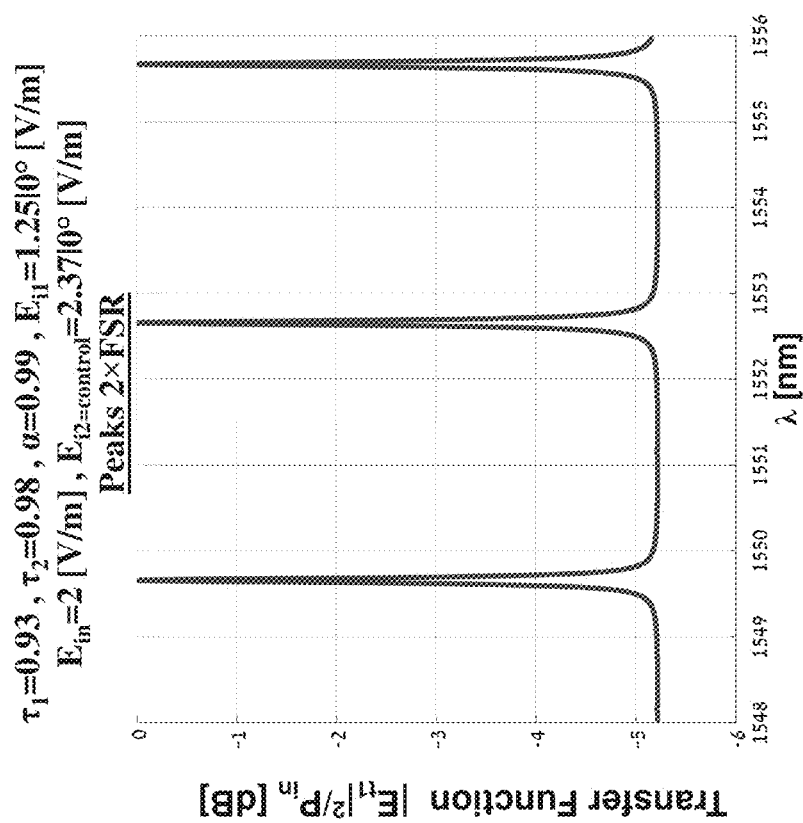
Figure 22:
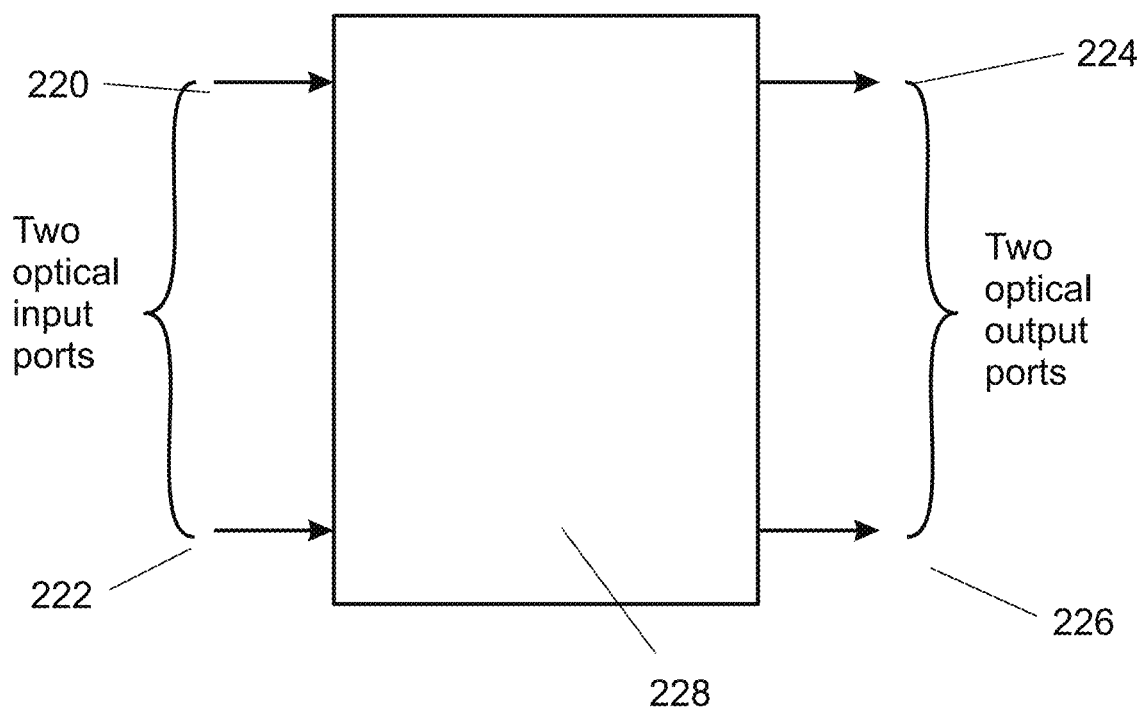
Figure 23:
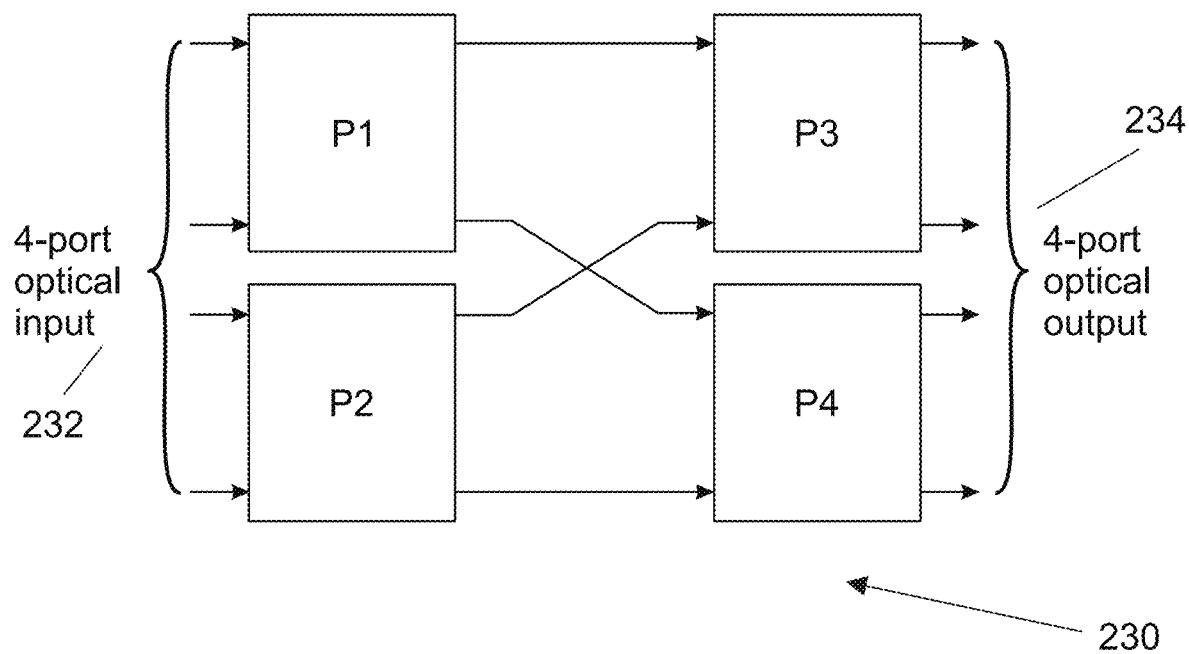
Figure 24:
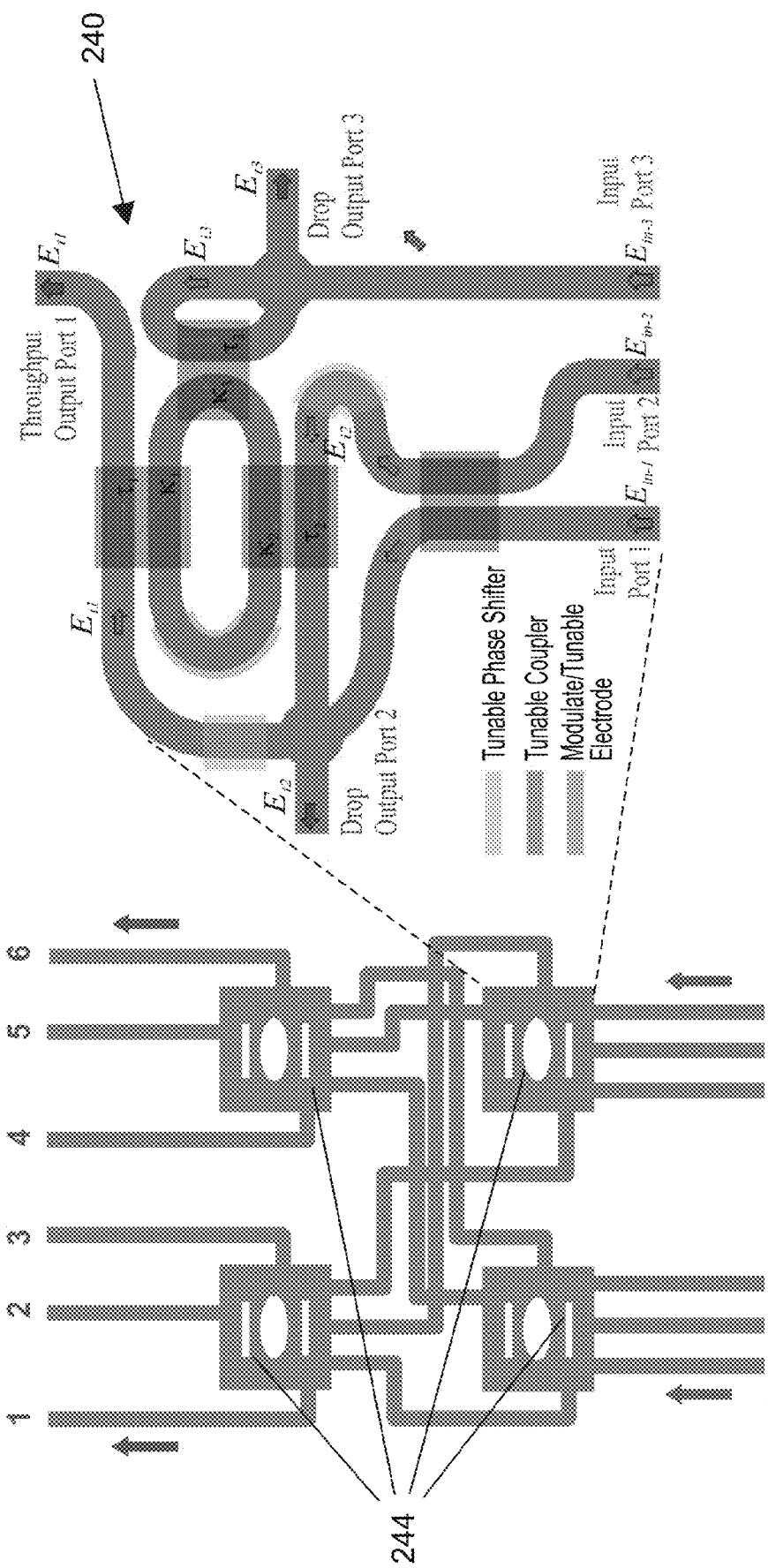

FIGS. 2A-J is a simplified diagram showing ten exemplary predetermined responses that can be achieved by suitable setting of the coupling coefficients in the coupling regions of FIG. 1;

FIGS. 3A-3C are three graphs illustrating the parameter insensitive response of a device according to the present embodiments;

FIGS. 4A-J shows a scanning electron microscope (SEM) image and spectral responses (Ea) of optical circuits using the device of FIG. 1;

FIG. 5A is a view of the trapezoidal cross-section for the parallel section of a device according to the present embodiments;

FIG. 5B is an illustration of the structure of a device according to the present embodiments, simulated in the software to analyze the ring/input couplers;

FIG. 5C is a simulated coupling coefficient as a function of the gap between the bus and ring waveguides (κ→power coupled to the ring);

FIG. 5D is a dispersion of a coupler for various lengths of parallel section;

FIG. 6 is a simplified schematic diagram of a double injection device according to the present embodiments;

FIG. 7 is a simplified schematic diagram of an alternative double injection device according to the present embodiments;

FIG. 8 is a simplified schematic diagram of a further alternative of a double injection device according to the present embodiments;

FIG. 9 is a simplified schematic diagram of a yet further alternative of a double injection device according to the present embodiments;

FIGS. 10A-10C are diagrams of a yet further double injection device and graphs showing its use for QAM;

FIG. 11 is a simplified diagram showing how multiple double injection devices of the present embodiments may be combined into a grid to form an optical array, including a programmable optical array;

FIGS. 12 and 13, illustrate additional response shapes, in particular a Fano resonance shape, which may be obtained using the present embodiments;

FIG. 14 is a simplified schematic diagram showing a variation of the present embodiments in which Multiple Free-Spectral-Range (FSR) states are achieved by placing one of the input ports at a different location than directly opposite the other input port;

FIG. 15 is a simplified schematic diagram showing a device according to the present embodiments comprising three coupling regions and three injections waveguides and corresponding coupling points according to embodiments of the present invention;

FIGS. 16A to 16C and 17A to 17C are further configurations of the double injection device of the present embodiments in which the Y-junction or other splitting element is eliminated and an independent reference optical field Eref is injected into one of the ports, together with graphs showing the output responses;

FIG. 18A to 18C are a configuration of the present embodiments and corresponding graphs for phase modification and detection;

FIG. 19A to 19F are an embodiment and corresponding graphs in which the output is responsive to variations in input optical power;

FIGS. 20A to 20C and 21A to 21C are configurations and corresponding graphs according to the present embodiments in which as with FIGS. 19A-F, optical input power allows for changing between FSR states;

FIG. 22 illustrates a theoretical diagram for forming a programmable matrix from a two-injection optical device as shown in FIG. 14, according to an embodiment of the present invention;

FIG. 23 illustrates a simplified theoretical diagram showing how four of the devices of FIG. 15 may be combined to form a four by four matrix array; and FIG. 24 is a simplified diagram showing a four x triple device configuration, that includes a 6×6 formation, with electrodes according to the present embodiments.

DESCRIPTION OF SPECIFIC EMBODIMENTS OF THE INVENTION

The present invention, in some embodiments thereof, relates to a ring-type resonator using double triple or larger injection structures for response shaping in frequency and time domains, and may include an optical response shaper and/or a modulator device with multiple injection. In addition, multiple individual devices may be connected together to form matrix arrays. By the term 'response shaper' is meant a device able to modify the time dependence and/or the spectral content or the phase of a given input optical signal. The device comprises a resonator having an enclosed geometric structure, for example a ring or racetrack structure, at least two injecting optical waveguides approaching the resonator to define at least two coupling regions between the resonator and the injecting waveguides, and defining at least two Free Spectral Range states. The free spectral range states may comprise a first, regular, state and at least one additional larger period state. One or both of the coupling regions has a coupling coefficient selected for a predetermined frequency or time or phase response, and the coupling coefficient may be variable in real time to render the response programmably variable. In one embodiment, multiple electrodes may be variably programmed at each coupling region to modify the response, and in another embodiment the input power of one of the injected signals may be used as a reference or control to modify the other or others.

The double injection (DI) device is modified in the present embodiments to provide a range of responses by varying the coupling coefficients or other device parameters. That is to say a variable parameter double injection device may be provided. In one embodiment the input ports of the injection waveguides may be offset arbitrarily from one another in terms of displacement relative to a plane perpendicular to the axial direction of the waveguides, meaning that each injection port is at a different displacement relative to the plane. A feature of certain embodiments of the DI design is that they comprise a single ring resonator, and require one operating electrode for operation of the resonator. The operating electrode is not to be confused with the electrodes used for altering the device properties discussed. The use of a single operating electrode may alleviate mismatch issues typically occurring in systems that depend on complementary devices (Class AB/B). Since only a single ring is required, the circuit is relatively simple to design and manufacture and there are no cumulative fabrication variances, thus making the device much less sensitive in most configurations. In terms of real-estate and power consumption, this is also significant when considered in a practical receiver/transmitter setting incorporating arrays of Electro-Optical (EO) elements on chip.

In the present embodiments there may be electrodes placed in the vicinity of the coupling regions to make the device dynamically programmable by altering conditions at the coupling regions. Even with these electrodes in the vicinity of the coupling regions, the devices may be significantly simpler than other reported architectures.

Interestingly, the device provides most of its transmission responses with a larger FSR than expected, that is to say typically twice that of a conventional ring of the same size, without decreasing the perimeter of the resonator. This feature allows providing the same bandwidth, without increasing the required operational voltage, consequently generating less heat, which further dissipates over a larger area. Despite being a resonance device, most of the transmissions obtained do not adhere to any critical coupling condition and hence variations in the loss coefficient barely degrade the ER. Some transmissions however exhibit even higher sensitivity compared to single-pass devices (e.g. asymmetric MZI).

Shaping of the frequency response, or otherwise an electrical-to-optical response, is demonstrated by means of a racetrack-shaped ring resonator designed and fabricated in a configuration referred to herein as the Double Injection (DI) configuration. It will be appreciated that while a racetrack shape is shown, this is not essential to the present embodiments and any continuous closed shape may be used. The DI configuration of the present embodiments possesses a property that it allows two Free Spectral Range states, namely the regular state and a larger e.g. double regular state (regular, 2×regular) to exist for a single racetrack length.

Shaping in the present embodiments is realized by selecting different coupling coefficients that provide a variety of transmission shapes or types, as will be explained herein below. Specifically, the present disclosure demonstrates various shapes including: sinusoidal, triangular (linear), square (bandpass), dips and peaks (2 states), spikes (tangent-like), interleaver, fano-spectrum and a so-called, 20 dB-min Parameters-Insensitive-Response modulator. The transmission types have been realized, fabricated in a silicon-on-insulator platform and characterized at wavelengths around 1,550 nm.

The present disclosure introduces various shaped responses obtained with the DI resonator. In particular, an analysis in greater detail is provided for one of the shapes: a Parameters-Insensitive-Response that provides an ER of at least 20 dB, referred to as PIR20. The various responses, differing in coupling coefficients, have been fabricated using silicon photonics technology and then characterized experimentally.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1 is a simplified schematic diagram showing a Double injection resonator having dual FSR states. The DI resonator is embedded in a basic configuration as a passive structure. This configuration can attain 2 distinct FSR values with a single resonator.

The underlying idea of the DI configuration is to inject at least two, mutually coherent, light signals of the same wavelength to a resonator in pre-determined positions. A basic configuration according to one embodiment of the present invention is described in FIG. 1. An input waveguide 1 is divided into two waveguides 2 and 2' by means of a Y-junction 10 or other splitting element. The junction 10 is designed to divide the input optical field in a suitable ratio: 50:50 or other, depending on the required functionality. Each of the two waveguides, 2, 2', hereinafter denominated Injecting waveguides, is configured so as to approach the vicinity of the ring resonator at two respective locations 3 and 3', and to approach sufficiently close to allow coupling of the optical guided field between the resonator and the Injecting waveguides. The corresponding two coupling coefficients are set to attain predetermined transmission functionality between the input port 1 and throughput port 4. The values of the coupling coefficients are determined either passively at the fabrication stage or actively by actuating a suitable physical effect, i.e. electrodes, that change the coupling coefficients, using for example the electro-optic, thermo-optic, non-linear-all-optical effect—the Kerr effect, or other light-control effect. An electrode may use the plasmonic effect, or a stress induced effect or the electrode may be any electrode, method or sub-device (for example: an EO MZI) which is capable of controlling the properties (amplitude, phase, polarization and wavelength) of electromagnetic waves between a resonator and an injecting waveguide.

Mathematically, the model describing the electromagnetic field dependent on the wavelength for two injecting waveguides is given by $$E_{t1}(\lambda) = \frac{(\tau_1 - \tau_2^* \alpha e^{-i\theta})}{1 - \tau_1^* \tau_2^* \alpha e^{i\theta}} |E_{i1}(\lambda)| e^{i-\Phi_{i1}} - \frac{\kappa_1 \kappa_2^* \sqrt{\alpha} \, e^{-i\frac{\theta}{2}}}{1 - \tau_1^* \tau_2^* \alpha e^{-i\theta}} |E_{i2}(\lambda)| e^{i\Phi_{i2}}, \quad (1)$$

where $\tau = |\tau| e^{-i\varphi_\tau}$, $\kappa = |\kappa| e^{-i\varphi_\kappa}$, $\alpha$, $E_i$ and $\Phi_i$ are the transmission and coupling coefficients of the directional couplers, the loss coefficient of the ring, injected fields and their phases, respectively. $\theta$ is the phase accumulated by the light traversing the ring at steady state $$\theta(\lambda) = \frac{2\pi}{\lambda} \cdot n_{\text{eff}}(\lambda) \cdot L_{Ring}, \quad (2)$$

with $\lambda$ being the wavelength, $L_{Ring}$ the perimeter of the ring and $n_{\text{eff}}$ the effective index of the propagating mode. This model, applied usually for a classical add-drop ring resonator model, can also describe a classical notch resonator ($E_{i2}=0$, $T_2=1$).

The basic configuration, depicted in FIG. 1, inherently provides the ability to set electrodes in the waveguides leading towards the resonator from the junction 10, the input splitter via the so-called arms 2 and 2'. The electrodes may serve either as phase calibration electrodes or signal modulating electrodes. FIG. 6, further discussed below, illustrates the basic DI configuration with a possible electrode distribution. The electrodes may influence some of the parameters, such as $E_i$ and $\Phi_i$, of equation (1).

The DI resonator, if realized with no programming electrodes as shown in FIG. 1, or with electrodes that serve for tuning purposes only, may be operated as a passive programmable waveform shaper or a multi-functional filter. If realized with electrodes that allow for variation in the resonator's phase or coupling coefficients in real time, then the result may serve for modulating an input signal in the time domain, so that the DI resonator acts as a modulator device. Depending on the type of electrodes and their purposes, the DI device may operate both as a modulator and programmable response shaper at the same time.

Configurations comprising DI resonators may include Multiple Injections (MI), for example triple injections, but at least two injections are required. Each injection may contribute an additional new FSR state and naturally provide the ability to set an electrode over the corresponding arm. Since the injection relates to the resonator via a coupler, the number of free independent parameters increases while still using only one ring. The additional parameters may be selected to provide an additional selection of useful response shapes as well as enhancing those in the absence of the new injection.

When designed in Double-Injection, light at the throughput port can be regarded as consisting of the combined contributions from two virtually, identical, add-drop ring resonators. The first ring is associated with input light $E_{i1}$ which is then emitted from the throughput port of this ring (i.e. the throughput port in FIG. 1); the second ring is associated with input light $E_{i2}$ which is then emitted from the drop port of this ring (again the throughput port in FIG. 1). Thus, the left half portion of the second ring can be considered as a delay line of length $L_{Ring}/2$.

Note that the output transmission and the FSR of the DI resonator may resemble that of a conventional ring when either $E_{i1}$ or $E_{i2}$ is very small (the more conventional case), or when the first ring leans towards critical coupling, i.e. $\alpha \sim |\tau_1/\tau_2|$. In any other case, the delay line may dictate the FSR and transmission may be the result of the contribution made by both virtual rings. The second virtual ring, whose drop port is the relevant output for the DI resonator, does not have a critical coupling condition. It follows from the above discussion that devices based on DI design possess an exclusive property of being able to operate in one of two FSR states, linked to either $L_{Ring}/2$ or $L_{Ring}$, without modifying the length of the resonator. It is possible to control the period of the first FSR state, linked to $L_{Ring}/2$, by positioning the second injection (the lower injection in FIG. 1) nearby the ring at a location that creates the required delay line. For the basic configuration, where the position is exactly half of the ring perimeter, i.e. $L_{Ring}/2$, the common FSR formula for the larger FSR is then given by $$FSR_\lambda = 2\frac{\lambda^2}{N_g L_{Ring}}, \quad (3)$$

where $N_g$ is the refractive group index. This FSR, which is twice the value expected of a conventional ring, may also prove beneficial for detection purposes as it inherently provides a larger operational bandwidth.

The resonator may be a ring structure or a racetrack structure or a disk structure or a Fabry-Pérot type structure or a Photonic-Crystal based structure or any structure that forms, and behaves as an optical resonator.

Response Shaping

Reference is now made to FIGS. 2A-2J which are a series of ten graphs presenting various response shapes of interest obtained using the DI resonator of FIG. 1 by choosing adequate coefficient values.

In FIGS. 2A-2D, the shapes are respectively triangular (linearized), square (bandpass), sinusoidal, and interleaver. The shapes in FIGS. 2E-2G are respectively notch (2×FSR), peaks (2×FSR) and spikes (tangent-like). The shapes in FIGS. 2H-2J are respectively classical notch, classical peaks and Parameters-Insensitive-Response (PIR20).

Commercial software was used to simulate the circuit (via a steady-state model based on equation (1) above) and the waveguide dispersion, $n_{eff}(\Delta)$, of the fundamental mode for a typical channel waveguide 450×220 nm in silicon photonics. Common to all responses are the parameters: $L_{Ring}=1,500$ µm, $\varphi_{\tau,\kappa}=0°$ and $|E_{in}|^2=1$ a.u.

Figure 2A:
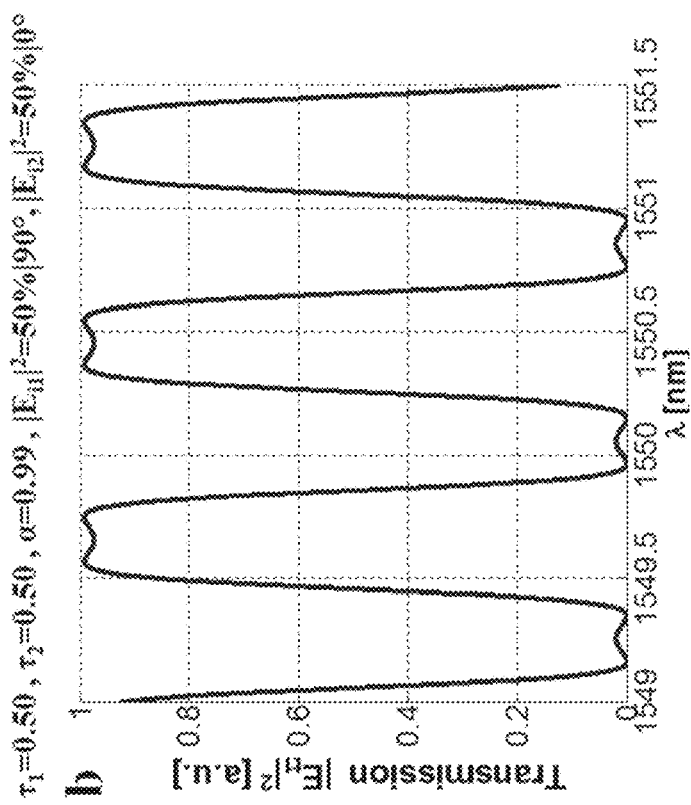
Figure 2B:
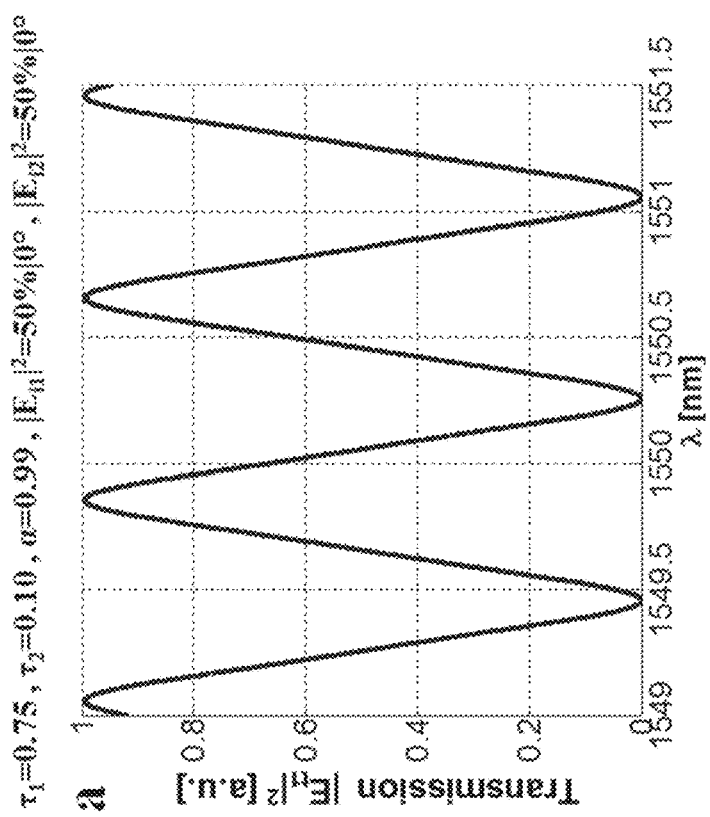
Figure 2D:
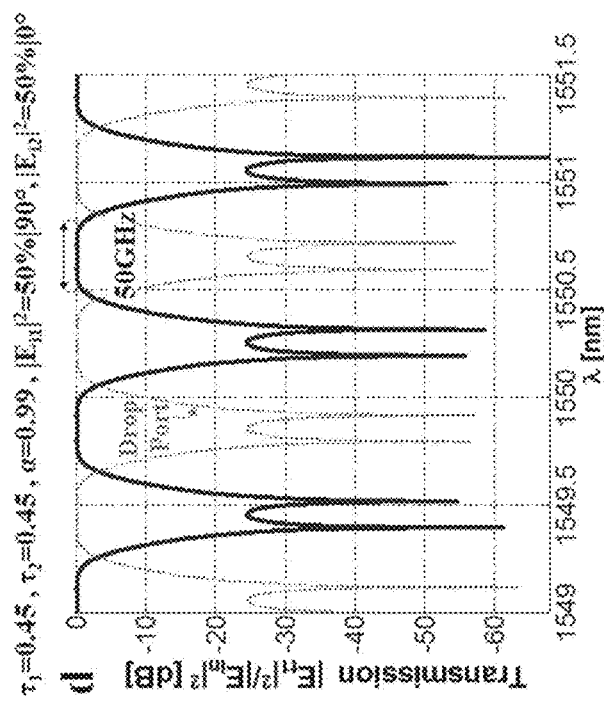
Figure 2C:
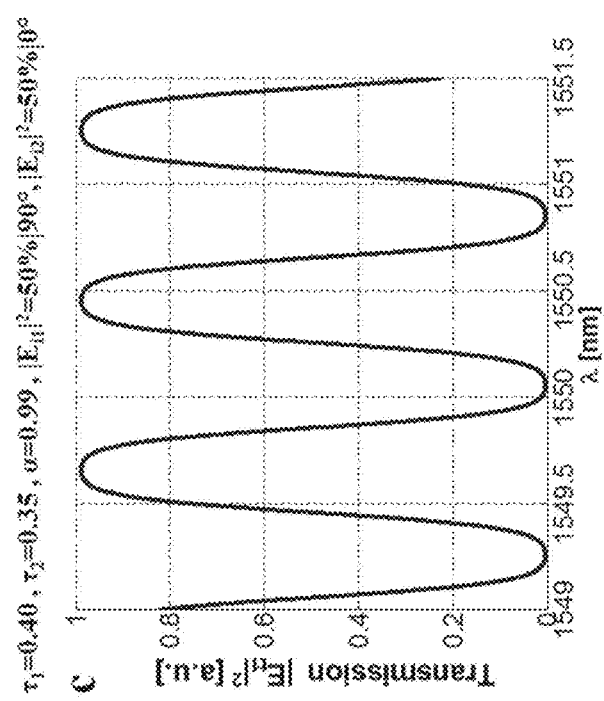
Figure 2H:
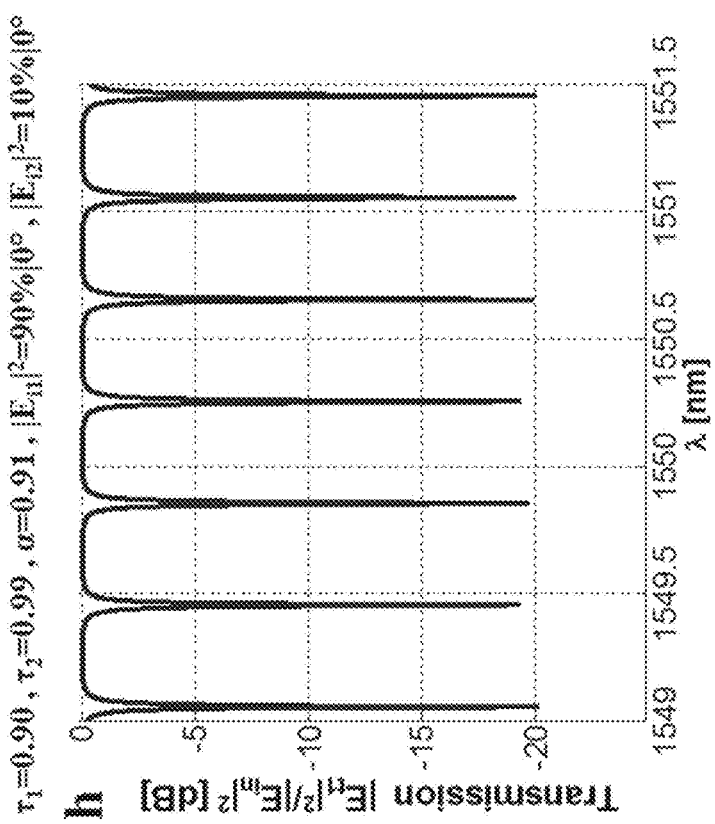
Figure 2G:
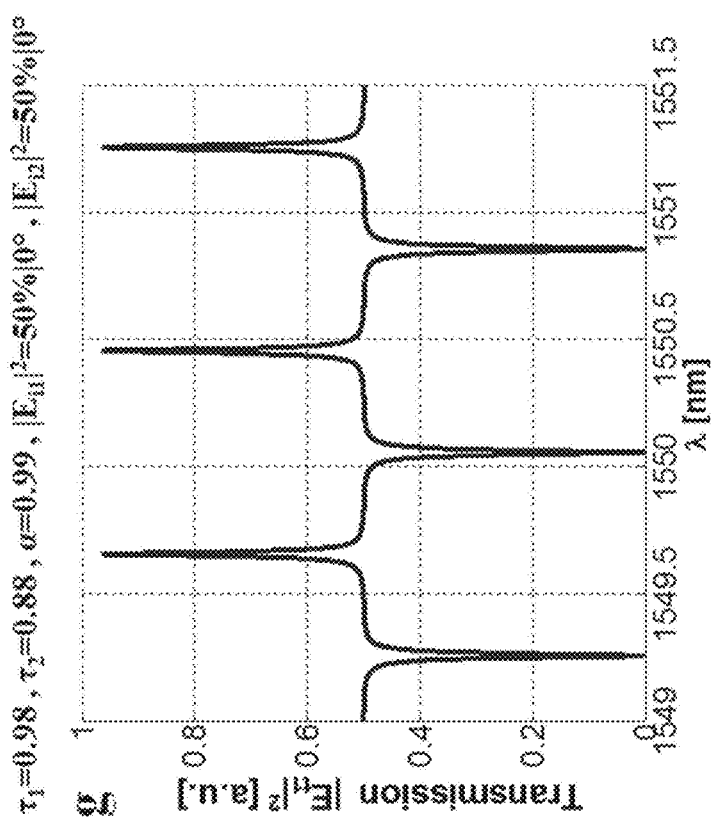
Figure 2J:
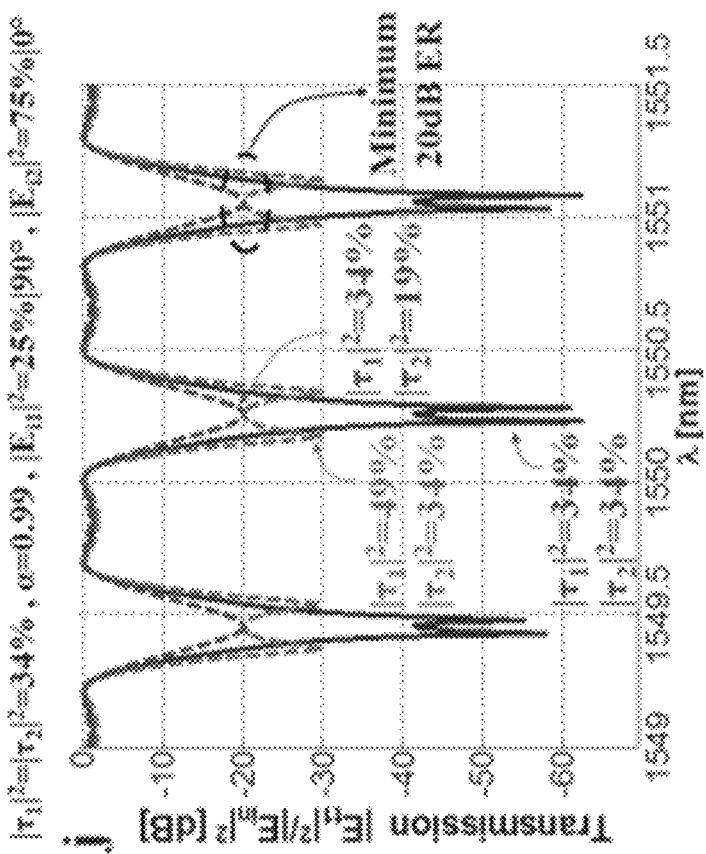
Figure 2I:
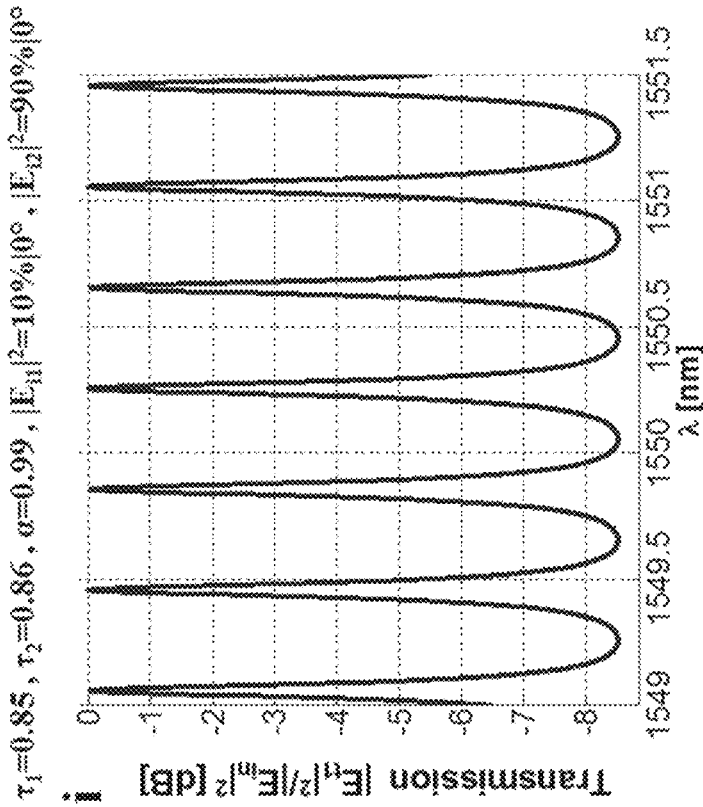

The linearity of the response shape in FIG. 2A was analyzed theoretically and revealed a high SFDR value of 132 dB with superior performance in the RF regime compared to RAMZI-based devices. In FIG. 2D, a flat-top interleaver shape with passbands of 50 GHz at the −3 dB corner points and cross-talk below −25 dB is shown. For a ring perimeter of 5,600 µm, the device can be characterized as a Nyquist interleaver with a passband of 12.5 GHz at −3 dB and a −25 dB bandwidth of 19 GHz (−25 dB interchannel isolation at 50% of the Nyquist frequency). Although its roll-off behavior is less sharp than of the recent RAMZI work, the DI resonator footprint is half the size. It may be observed that for the larger FSR notch and peaks shapes, as shown in FIGS. 2E and 2F, the Q-factor is the same as that which a ring would have in conventional notch and add-drop configurations. In FIG. 2J a wideband attenuation response with a minimum ER of 20 dB is shown for three different values of $\tau_1$ and $\tau_2$. The imbalance input power ratio (25%/75%) helps to decrease the sensitivity of the couplings value. This functionality is studied in greater detail hereinbelow. Note that for responses presented in arbitrary units (a.u.), an average of 25 dB ER is obtained.

The shapes are realized by tailored coefficients $\alpha$, $\tau_1$, $\tau_2$, $E_{in}$. The notation $|E_{ix}|^2=P\%|\Phi°)$ indicates that P percent of the input power goes to $E_{ix}$, where $\Phi°$ is the phase of $E_{ix}$ relative to $E_{in}$.

Parameters-Insensitive Resonator/Modulator

Placing an electrical element, such as a PN diode, PIN diode, MOS capacitor or a solid-state transistor over the ring, but generally excluding coupler regions, converts the passive resonator into an electro-optical modulator. A recent estimate in silicon photonics for basic fabrication deviations, such as waveguide width, height, sidewall angle and cleaning artifacts, indicated about 15 nm deviation in the coupling region. This may alter the splitting ratio of a directional coupler by more than 10% and directly impact the ER by several to a few tens of decibels.

Reference is now made to FIG. 3A, which is a graph that shows the optical output power as a function of an applied voltage for the PIR20 device whose wavelength response is depicted in FIG. 2J. 2V is required to attain 20 dB attenuation; voltages between 2.0-4.4V will provide even better than 20 dB of attenuation.

FIGS. 3B and 3C, respectively, present the ER of the PIR20 modulator and a cross-bar MZI modulator as a function of the couplers splitting ratio. The cross-bar configuration, which is typically realized by two directional couplers or multimode interference couplers, enjoy smaller footprints and lower optical losses compared to a traditional Y couplers-based MZI. In addition, the former couplers (if symmetrical) inherently differentiate the two signals by a π/2 phase, thus, avoiding the need to bias the MZI with a short delay line or otherwise by a DC (direct current) electrode. To obtain a similar EO performance to the PIR20, the MZI arms were set to 1,000 μm (assuming a push-pull configuration), and a typical waveguide loss of 3 dB/cm has been assumed for both devices.

In order to minimize the impact of fabrication deviations, so as to guarantee minimal ER value, the couplers of both devices may be designed to a central splitting ratio value. Such a design value may be at the center of the largest rectangle (w.r.t. FIGS. 3B and 3C) whose inner points provide a set of coupling values that yield at least the minimum attenuation. The rectangle size defines the parameters-insensitive range of the device. From FIGS. 3B and 3C, these central values are $|\tau_{1,2}|^2=34\%$ for the PIR20 resonator and $|\tau_{1,2}|^2=50\%$ for the MZI, when a minimal ER of 20 dB is considered. It is evident from the figures that the "insensitivity" range of the PIR20 resonator is twice that of the MZI and safely covers the discussed range of potential fabrication variances. Notice that for a conventional ring resonator, this range is less than 1% (see upper-right corner of FIG. 3B), i.e., a slight deviation drastically degrades its ER. In general, the PIR20 resonator may be sensitive to deviations of the input splitter, and the MZI to variations in the arms, and such sensitivity may result in additional phase deviation. In both cases, 3D simulations reveal that the abovementioned tolerances remain intact, i.e. $|\Delta\tau_{1,2}|^2=\Delta|E_{i1}|^2=20\%$ for the PIR20 as compared to $|\Delta\tau_{1,2}|^2=\Delta\Phi_{arms}=10\%$ for the MZI.

As discussed, FIGS. 3A-3C show parameter-insensitivity of the device (PIR20) of FIG. 2J compared to an MZI. FIG. 3A shows the transmission of the PIR20 as a function of an applied voltage over a 1,400 μm MOS capacitor electrode. The voltage alters $n_{Guide}$ (linearly for a capacitor) through the plasma dispersion effect ($\Delta n_{Guide}$ of $-4\cdot10^{-4}$ at 2V), consequently changing $n_{eff}$. FIGS. 3B and 3C show ER value as a function of the couplers splitting ratio for the PIR20 and the cross-bar MZI modulators, respectively. The black dots 20 and 22 in the centers of the rectangles 24 and 26 are the central splitting-ratio values which may be targeted in the design.

For applications requiring limited bandwidth, such as interleavers, filters or bandwidth-limited switches, the MZI arms may typically be imbalanced, that is in terms of length: thus for example the two arms may be 1,000 μm and 1,900 μm for a 40 GHz Bandwidth. The added delay line, of length 900 μm, which creates an asymmetry in the losses between the two arms, hardly degrades the insensitivity range. However, variations in the loss coefficient itself will affect the MZI more strongly than the PIR20.

Quadrature Amplitude Modulation (QAM)

In the basic DI configuration, if electrodes are distributed to control $\Phi_i$ and θ, it is possible to manipulate both the phase and amplitude of the optical field emitted from the throughput port, to achieve advanced signal constellations. Such signals are required in modern communication architectures such as, for example, Phase Shift Keying (PSK), Pulse Amplitude Modulation (PAM), Quadrature Amplitude Modulation (QAM) and Amplitude and Phase Shift Keying (APSK). For QAM, or APSK signal generation, placing electrodes over the DI resonator and upper arm, it is possible to control the optical field intensity and phase (from 0 to 2π). Since DI-based devices have a larger FSR state, the number of unique points within the pool of output points increase proportionally to the FSR period. This property may reduce the error between the required signal point and the available signal point (quantization noise), as more points are available for the same resonator length. FIGS. 10A-10C show a possible configuration of a DI-based resonator operating at the larger FSR state and providing a QAM constellation via twice the number of unique pool points.

Field Programmable Optical Array (FPOA) for Photonic Signal Processing.

It is possible to place electrodes over the input/ring couplers in order to be able to fully reconfigure the couplers so as to generate various response shapes. Such a device may then participate in a grid of devices that link to each other to produce the response of a single, parallel/serially chained device. Linking can be provided by input to output port connections or by direct coupling via proximity. Shaping of the response may be in the frequency domain as well as in the time domain. In recent years, the research in this field of grids of optical devices has been accelerating as photonic processors are aimed at integrating with, or replacing, their electrical counterparts. FIG. 11 shows an illustration of a basic grid 110 that comprises DI devices 112 according to the present embodiments such as example 114. Example 114 includes first and second input ports 116 and 118 respectively, a tunable coupler 120, 122, and 124, tunable phase shifters 126 and 128, and a racetrack resonator 130 with tunable electrodes 132 and 134, a drop port 136 and a throughput port 138. The devices 112 are connected together in the grid 110 to form a photonic signal processor.

Results

Figure 4B:
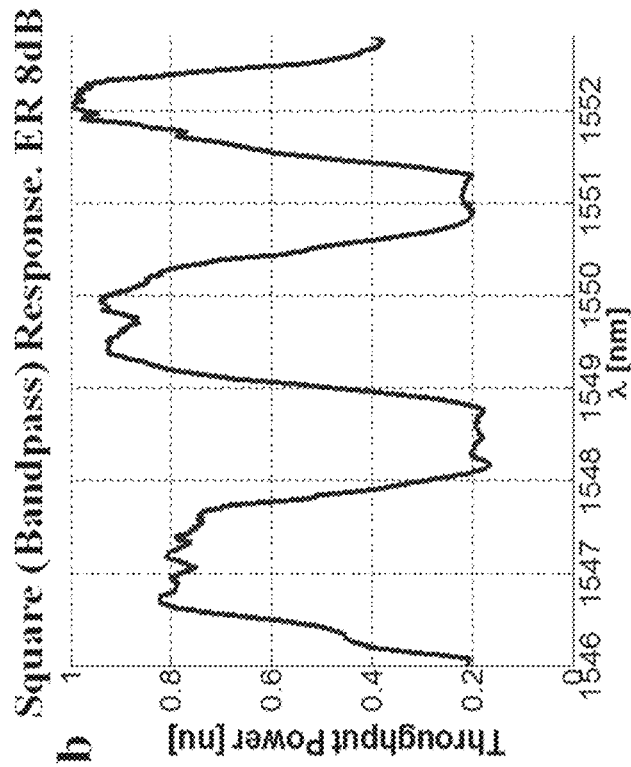
Figure 4A:
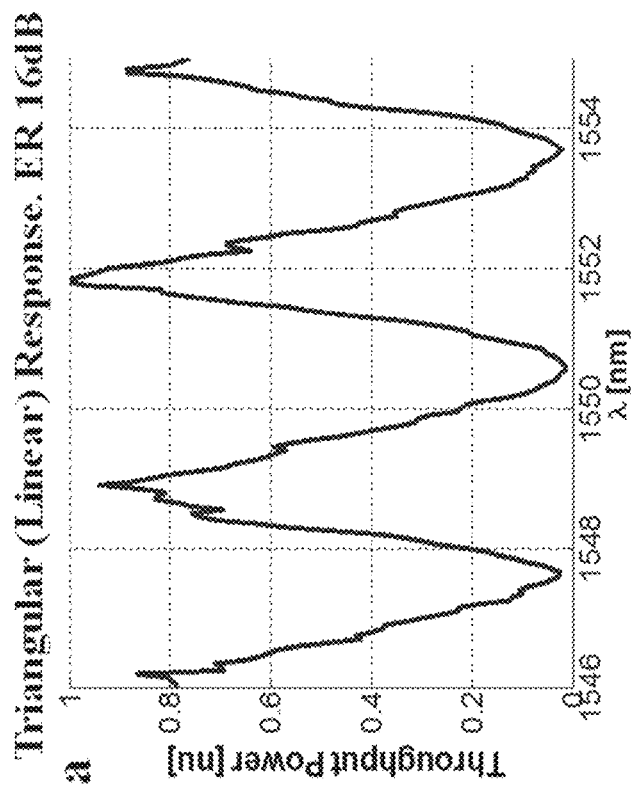
Figure 4D:
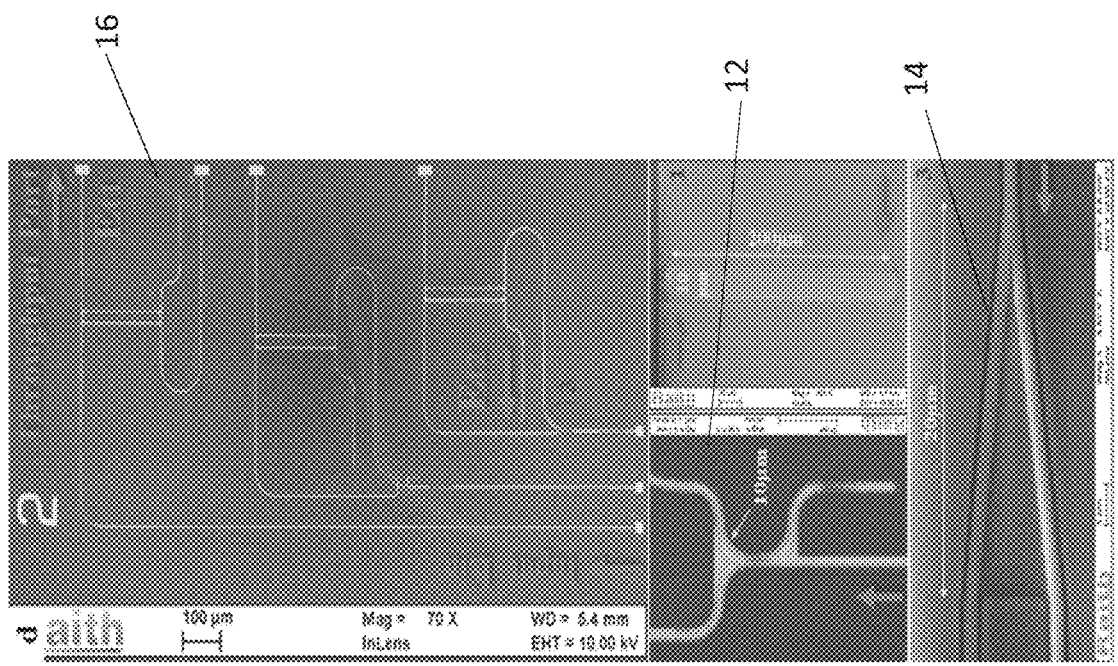
Figure 4C:
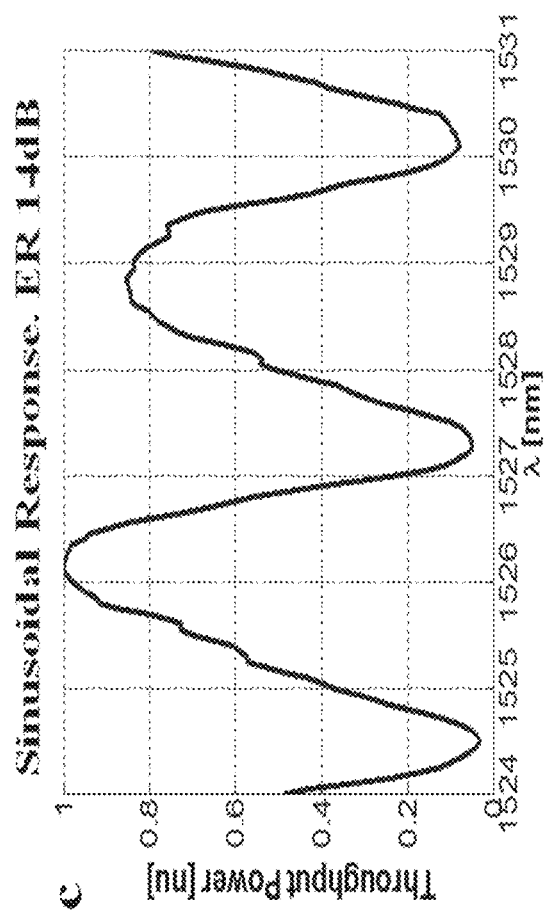
Figure 4F:
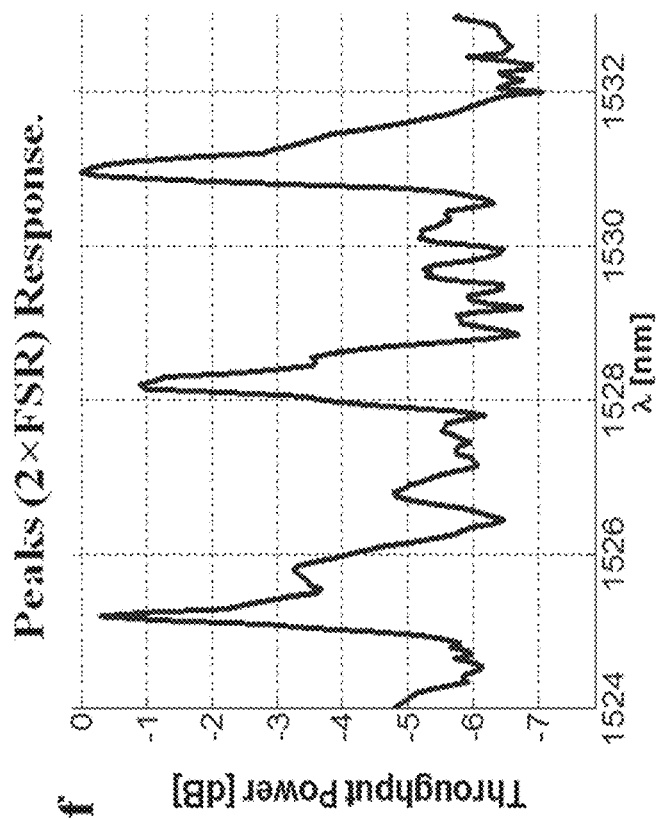
Figure 4E:
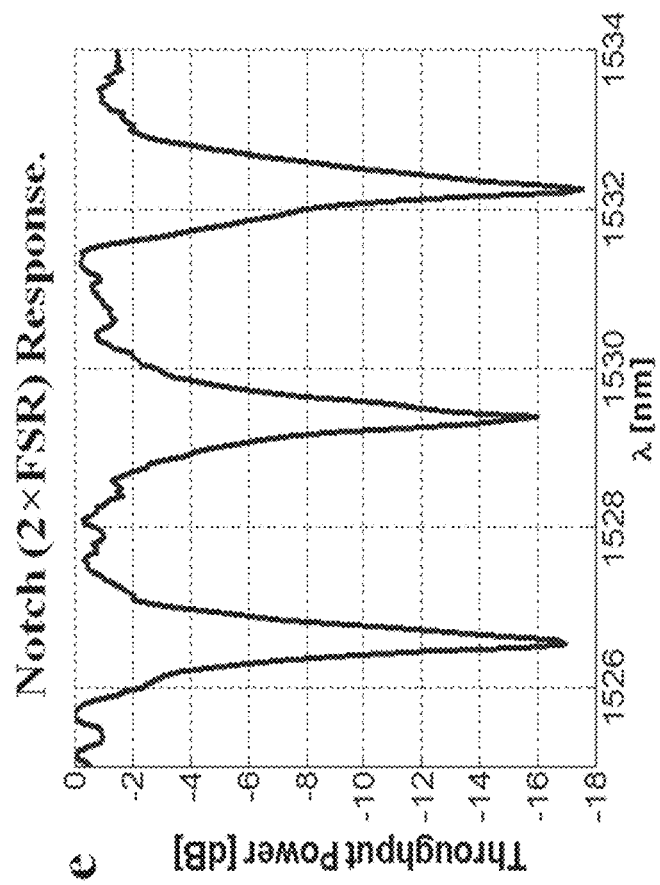
Figure 4H:
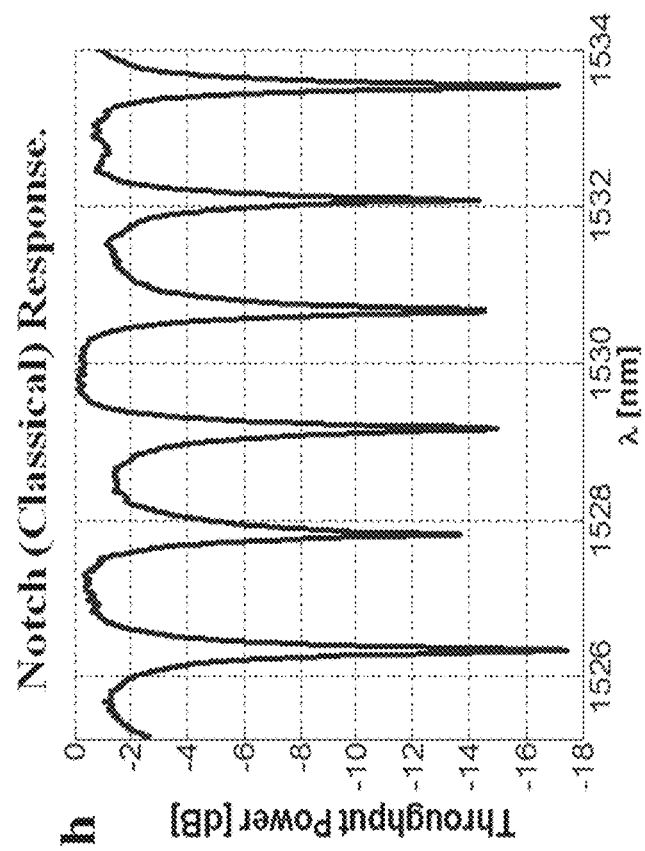
Figure 4G:
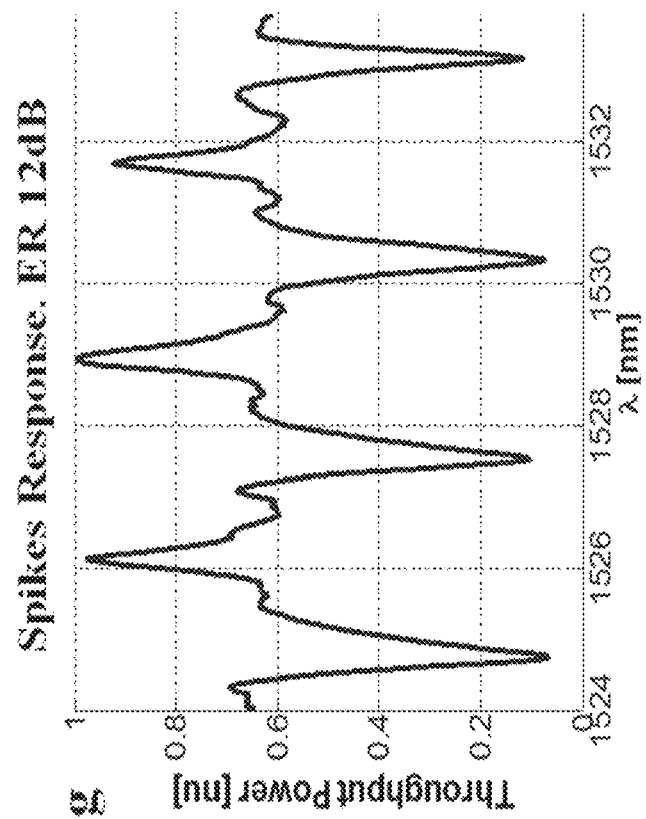
Figure 4J:
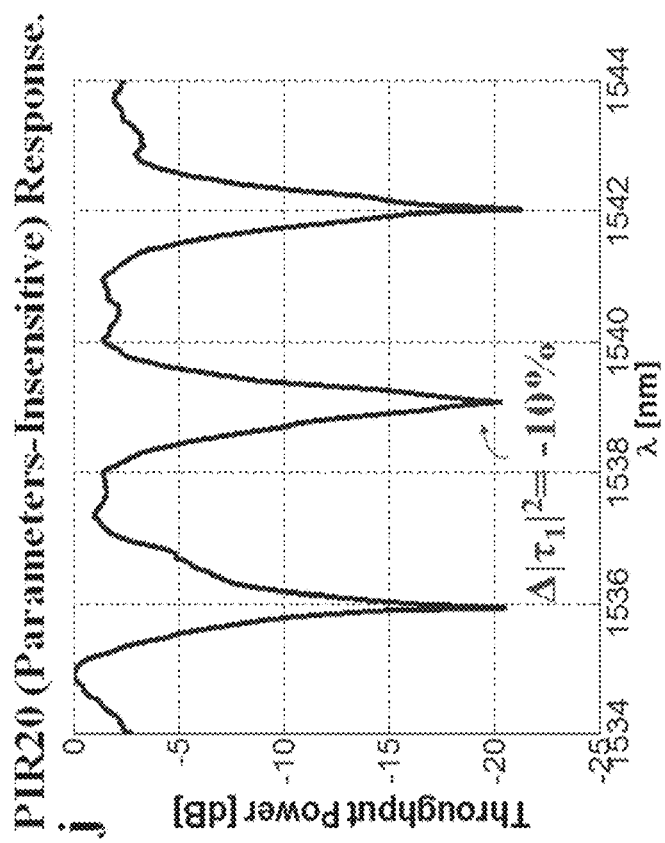
Figure 4I:
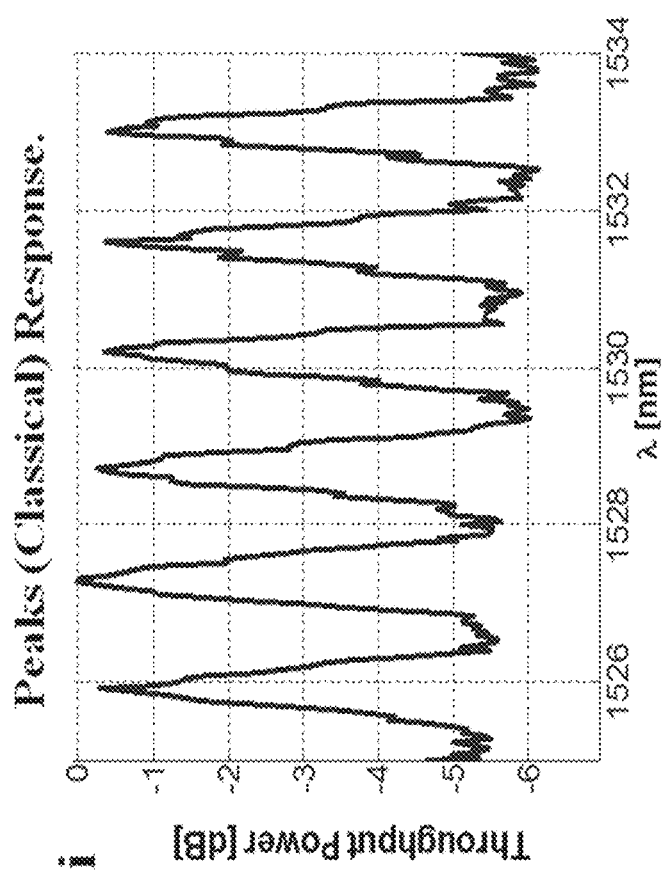

Reference is now made to FIGS. 4A-4J through which are demonstrated the various transmission responses using silicon photonics technology. FIG. 4D shows a Scanning Electron Microscope (SEM) view 12 of the complete optical circuit and a zoom-in view 14 of the racetrack resonator and input couplers. The spectral response of the devices around 1,550 nm (with resolution $\Delta\lambda<0.05$ nm) for the "TE" polarization is presented in FIG. 4A-J, in order of appearance corresponding to FIG. 2A-J. More particularly, in FIGS. 4A-4C, the shapes are respectively triangular (linearized), square (bandpass), and sinusoidal. The shapes in FIGS. 4E-4G are respectively notch (2×FSR), peaks (2×FSR) and spikes (tangent-like). The shapes in FIGS. 4H-4J are respectively classical notch, classical peaks and Parameters-Insensitive-Response (PIR20).

The racetrack perimeter is 477 μm and the average waveguide loss is 15 dB/cm or α=0.921 (estimated by fitting α and τ to one of the dips in a notch resonator employing the same racetrack). The two obtained FSR values were 1.4 nm, and 2.8 nm.

Specifically, FIGS. 4A-J show a SEM image FIG. 4D and spectral responses ($E_{t1}$) of optical circuits comprising the DI resonator. Some plots are in normalized units (nu). FIGS. 4A-C in the 1$^{st}$ row show shapes which are respectively triangular, square and sinusoidal. FIGS. 4E-4G in the 2$^{nd}$ row show shapes which are a notch (2×FSR), peaks (2×FSR) and spikes (tangent-like). The 3$^{rd}$ row shows FIGS. 4H-4J which are a classical notch, classical peaks and Parameters-Insensitive-Response (PIR20). FIG. 4D shows views of the fabricated Double-Injection device with either input splitter components: standard Y coupler 14 (bottom) or DC coupler (12, middle), and a reference device of a simple add-drop racetrack resonator (16 upper).

FIGS. 4A-4J may confirm that devices based on the DI resonator can produce a variety of response shapes by judicious selection of the couplings and input coefficients while providing significant ER and bandwidth. Improved dynamic range may be attained if the coefficients obtained in fabrication are close to theoretical coefficients. Due to coupler dispersion and mismatch between design and fabrication, some of the transmissions exhibit better match to theory at wavelengths other than those intended, resulting in a certain spectral-shift.

In FIG. 4J, a PIR20 device with an intentional deviation in coupler $\tau_1$ ($|\tau_1|^2$=24% instead of $|\tau_1|^2$=34%) yields a wideband notch transmission with 20 dB of ER. This deviation falls within the insensitivity range of the device, thus, supporting the analysis presented earlier for the PIR20 resonator. Note that the enhanced ER was also attained at a deviation in the measured loss coefficient relative to the original design ($\square$=0.92 vs. $\square$=0.99).

Discussion

A ring-type resonator designed in Double Injection configuration is shown to provide various response shapes by appropriately choosing the coupling coefficients and input power ratio. An inherent feature of the Double Injection configuration allows operation in two FSR states for the same resonator length. The greater FSR, twice the conventional value, can be utilized for obtaining wider operation bandwidth with lower power consumption in advanced transmission techniques. Some of the shapes presented include the triangular, rectangular, interleaver and the parameters-insensitive response.

The values of the parameters required for the realization of each response shape are significantly different from each other, thus avoiding unintended "roaming" among shapes, which may otherwise occur due to deviations in, e.g., fabrication, temperature and electro-optic effects. The obtained shapes are of practical relevance for various RF analog and digital applications at the transmitter as well as the receiver side.

The so-defined PIR20 modulator was analyzed and shown to be twice as tolerant to parameter deviations compared to a conventional MZI and significantly more tolerant compared to a conventional ring modulator. Designed to attenuate at least 20 dB with extended bandwidth and low operation voltage (2V), makes it a viable candidate for large scale integration.

The response shapes described in theoretical section were experimentally demonstrated by DI devices fabricated and characterized in an SOI platform. The devices transmission exhibited good ER behavior as a function of wavelength with similar shape and properties of their theoretical counterparts. In particular, a PIR20 device with an intentional deviation (10%) in one of the couplers, had provided a notch-like response with 20 dB ER, thus supporting the concept of extended tolerance. The richness of the shapes demonstrated in the present embodiments is intended to confirm the practical significance of the Double Injection configuration.

Methods

Fabrication. DI-based optical devices according to the present embodiments were fabricated. A Silicon-On-Insulator (SOI) substrate by SOITEC© was used with a 220 nm silicon layer lightly doped with Boron ($1.3 \times 10^{15}$ cm$^{-3}$) and a 2 μm native oxide layer underneath. The design was patterned to the chip by Electron Beam Lithography (Raith150) with ZEP520 resist. It was then etched using a deep Reactive-Ion Etching process to completely remove the silicon layer in order to form 450×220 nm channel waveguides. Finally, a 1 μm oxide layer was deposited on top by Plasma-enhanced Chemical Vapor Deposition. Once ready, the chip was coated with a standard resist and diced to from a 1×1 cm square chip. In each corner a few devices, with tapered waveguides at the facet, could be approached by external fibers (see FIG. 4D).

For responses requiring 50-50 input power splitting, a conventional Y-coupler (3 dB coupler) was employed to equally split the incoming light. For the square and sinusoidal shapes, a 90° phase difference is required. This was achieved by extending the lower arm by 110 nm to yield the proper phase. For such a short length, the added dispersion was found to be negligible. For other splitting ratios, a DC unit was placed instead of the Y-coupler. From the input splitter, the two waveguides continuing to the racetrack were curved, simulated and designed so as to deliver equal amplitudes and phases at entry. The drop port was not used, and thus the light continuing to the through port, i.e. $E_{t2}$, needed to be attenuated for suppressing re-coupling to the racetrack via reflections. This was realized by slowly narrowing the waveguide width to zero over some distance (~300 μm), thus allowing the propagating mode to rapidly convert into radiation modes. Such attenuating tapers were also placed in devices using a DC as an input splitter in order to suppress reflections.

Simulations.

The waveguide as produced in simulations had a trapezoidal cross section with exponent-like decaying walls. To simulate the circuit and couplers, a waveguide with trapezoidal geometry and complementary error-function (Erfc) decay profile was employed. To reduce dispersion of directional couplers we chose to work with a short parallel section, $L_c$=5 μm. The simulations may account for the curved parts of the coupler ($R_{curve}$=10 μm), however, their contribution was observed to be insignificant (around 1% of $|\tau|^2$).

Reference is now made to FIG. 5A, which is a SEM image showing the cross-section of the fabricated waveguide, the matched simulated structure and coupling profiles as a function of the DC gap and wavelength (dispersion). The gaps required for the various couplers used in the devices, varied between 50 to 250 nm.

More specifically FIGS. 5A to 5D show a waveguide cross-section SEM image and a simulated structure. FIG. 5A shows view of the trapezoidal cross-section for the parallel section of a DC. FIG. 5B shows an illustration of the structure simulated in the software to analyze the ring/input couplers. FIG. 5C shows the simulated coupling coefficient as a function of the gap between the bus and ring waveguides (κ→power coupled to the ring), and FIG. 5D shows the dispersion of a coupler for various lengths of parallel section.

FIG. 5D demonstrates the dispersion of the coupler for various coupling lengths. Even though a longer coupler results in larger dispersion, it is possible to find lengths that provide very small dispersion for a narrow bandwidth of the spectrum. This, however, will make the coupling change more rapidly as a function of the gap, thus making it harder to target specific values. Note that the dispersion, in this case, will be greater for the rest of the spectrum and the device footprint may increase. In general, the engineering and fabrication of a coupler for an optical circuit with specific needs, requires careful considerations.

Optical Measurements.

The spectral response of the optical devices was measured using an HP81689A tunable laser. The light propagated through Polarization Maintaining fiber and butt coupled via an imaging system to the silicon waveguide by a tapered fiber (2 μm spot size). Light coming from the chip was directed to an HP81637B photodetector. Both the laser and the photodetector were modules installed on an HP8163A mainframe that connected to a PC computer via GPIB interface. Commercial measurement software was used to control the equipment supporting the experiments. The setup was tuned for the "TE"-like ($E_x > E_y$) polarization and the fundamental mode was assumed to have been propagated in the device.

FIG. 6 is a simplified schematic diagram of a double injection device according to the present embodiments. FIG. 6 illustrates an exemplary double injection resonator 60 device according to the present embodiments which 114 includes first and second input ports 116 and 118 respectively, a tunable coupler 120, 122, and 124, tunable phase shifters 126 and 128, and a racetrack resonator 130 with tunable electrodes 132 and 134, a drop port 136 and a throughput port 138.

FIG. 7 shows a compact way to shape the Double-Injection (DI) resonator based-device 60 in order to obtain a smaller footprint of the DI device FIG. 8 illustrates accessing of a drop port using a typical waveguide crossing structure. If the drop port is required, a detector or an output coupler can be placed at the end of the port waveguide. However, another option can be attained using a waveguide crossing splitter to allow the light to continue further-on into the circuit:

The electrodes placed in the coupling region to make a programmable device, or at the ring waveguide may have thermo-optical properties. An example of that can be seen in the following figure:

FIG. 9 shows a DI device controlled by a thermal electrode 70 applying thermo-Optical effect.

Referring now to FIGS. 10A to 10C, FIG. 10A is a diagram of a yet further double injection device and FIGS. 10B and 10C are graphs showing its use for QAM and these figures are discussed further hereinabove. FIG. 11 has likewise been discussed hereinabove.

Reference is briefly made to FIGS. 12 and 13, which illustrate additional response shapes for optical devices having a single input. The so-called Fano resonance shape may be useful in such applications as high resolution sensors and ultra-low voltage modulators and switches.

Reference is now made to FIG. 14, which illustrates a variation in which Multiple Free-Spectral-Range (FSR) is achieved by placing one of the injections at a different location than directly opposite the second one. In device 140 a first port 142 and a second port 144 are mutually offset. Both couple to the racetrack resonator 146 as in the previous examples. The output pattern emerges at throughput port 148. The new position changes the length of the inherent delay line of the design, consequently, influencing on the FSR value. Thus, a device in double-injection (DI) configuration can provide response shapes at various FSR values and is not limited to the conventional FSR or double-FSR. This is achieved without the need to change the perimeter of the ring. A necessary condition would be that the so-called partial FSRs and the conventional FSR have a common divisor. Thus the response shape may be controlled by placing one of the injections at a location that is not strictly opposite the other injection.

Response shaping may be viewed in the time domain. Assume having a periodic electrical (voltage) wave in the time domain, and let this electrical wave drive the resonator electrode. Denote this as "input signal". Also assume that a photo-diode is connected at the device output. A periodic electrical signal may be obtained at the diode output having a different shape than the input signal.

The shape of the output signal can be modified by changing the voltages controlling other electrodes of the device. It is possible to perform frequency multiplication using this device.

Reference is now made to FIG. 15, which is a simplified diagram illustrating a device 150 for multiple—that is more than two—injection. Such multiple injection may be realized by adding additional coupling regions, thus providing more free parameters that can be used to shape the device responses or otherwise to enhance those found with fewer injections. Below is an example for triple injection in which three coupling regions, 152, 154 and 156 are provided. All three lead to couplings to racetrack 158 at different points. For the case of multiple injections, the input splitter can be realized by a DC splitter or MMI splitter. It is noted that the optical inputs need not be from a single optical source. The output shape emerges at throughput port 160

Figure 16A:
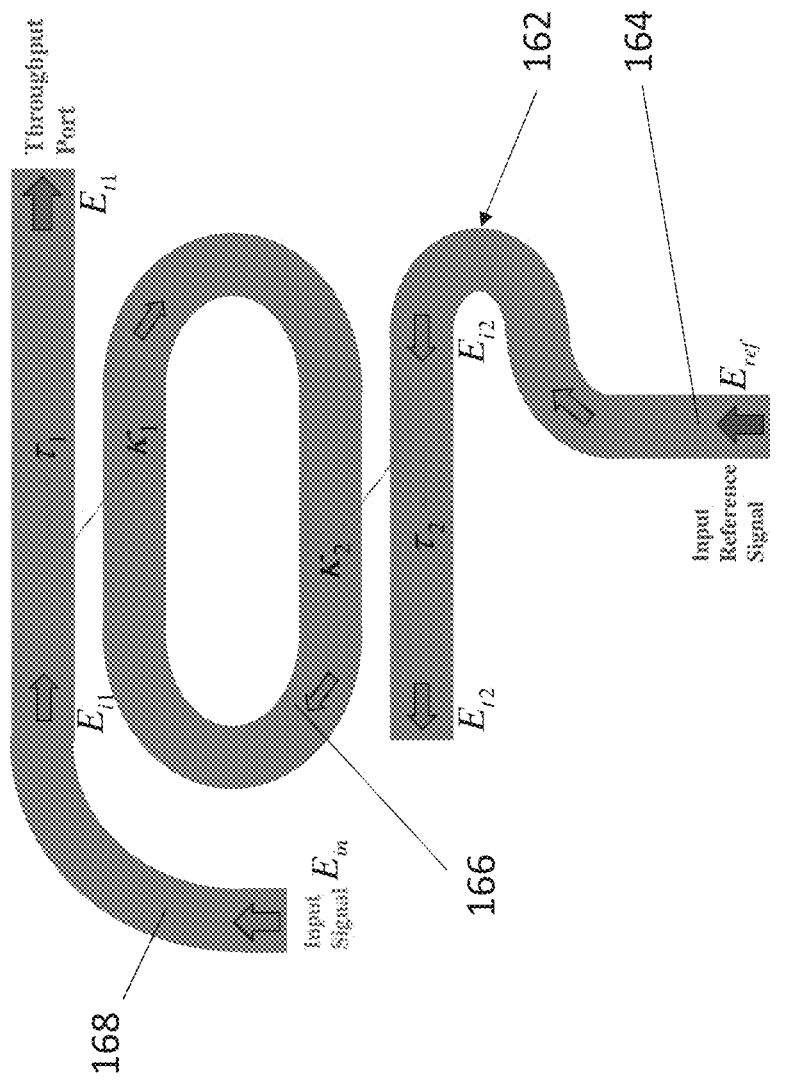
Figure 16B:
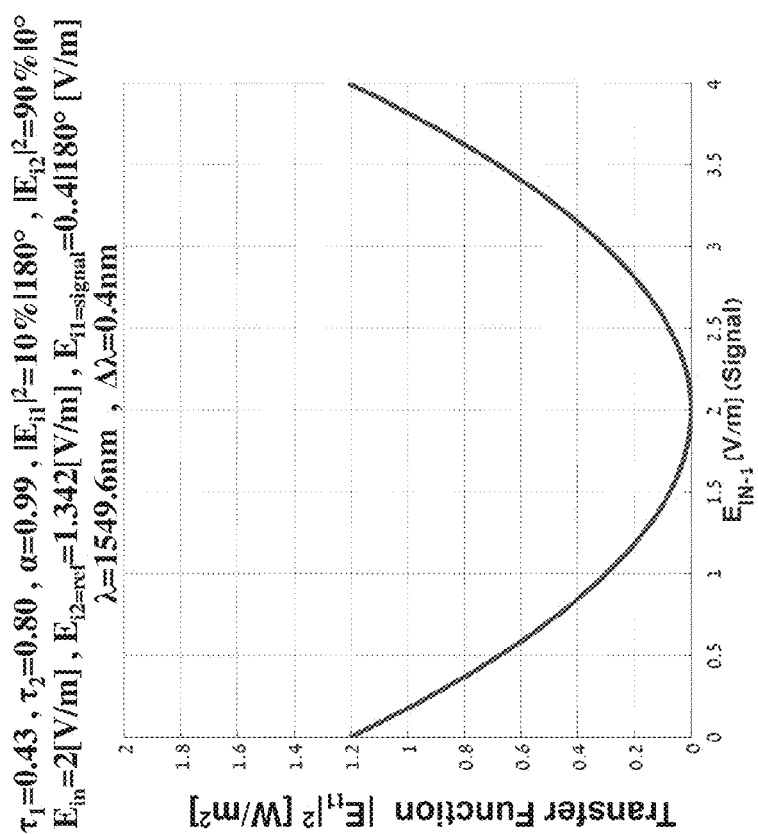
Figure 16C:
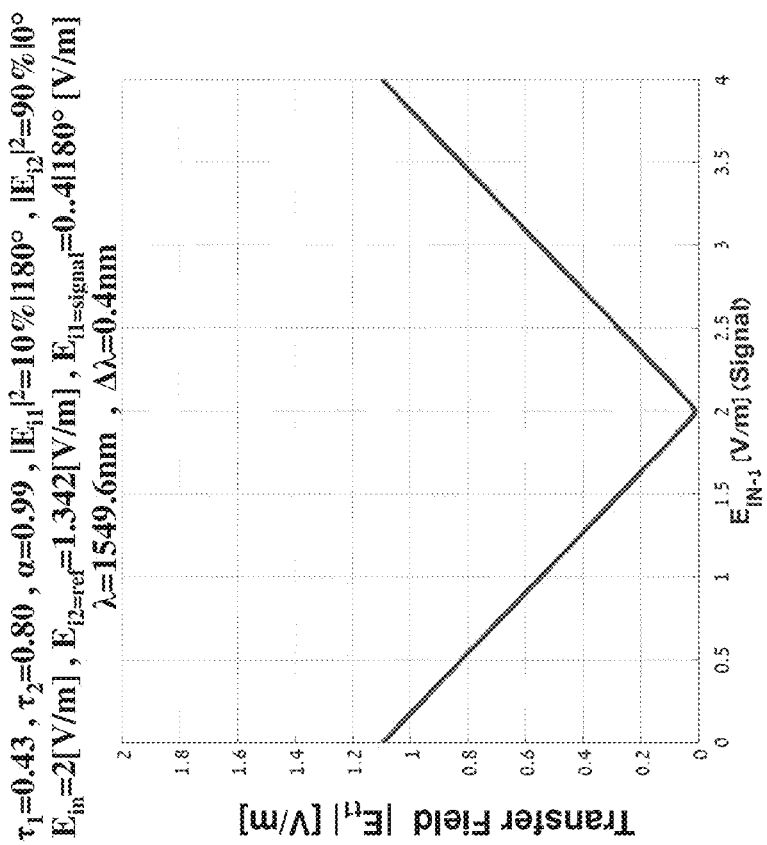

Reference is now made to FIGS. 16A, 16B and 16C, and also to 17A, 17B and 17C. In a further configuration of the double injection device, as shown at 162, the Y-junction or other splitting element is eliminated and an independent reference optical field $E_{ref}$ is injected into one of the ports 164. Both are coupled to the racetrack 166 in the normal way. This field, alternatively denominated the control field, is intended to affect the response of the input signal $E_{in}$ coupled into the other port 168 of DI device 162, in the frequency and/or time domain. In a possible configuration, the reference optical field may replace a control electrical field and its corresponding actuating electrode, providing a realization of an all optical device. In other embodiments the application of both control fields, optical and electrical, may be advantageous. The reference optical field may be generated close to the DI device, thus being a local oscillator, or at a remote location and may have the same optical carrier frequency as the input signal or a different one. The amplitude, power, phase or frequency of the independent reference optical signal may control the transmission function of the signal as shown in FIGS. 16A-C and 17A-C.

Figure 17A:
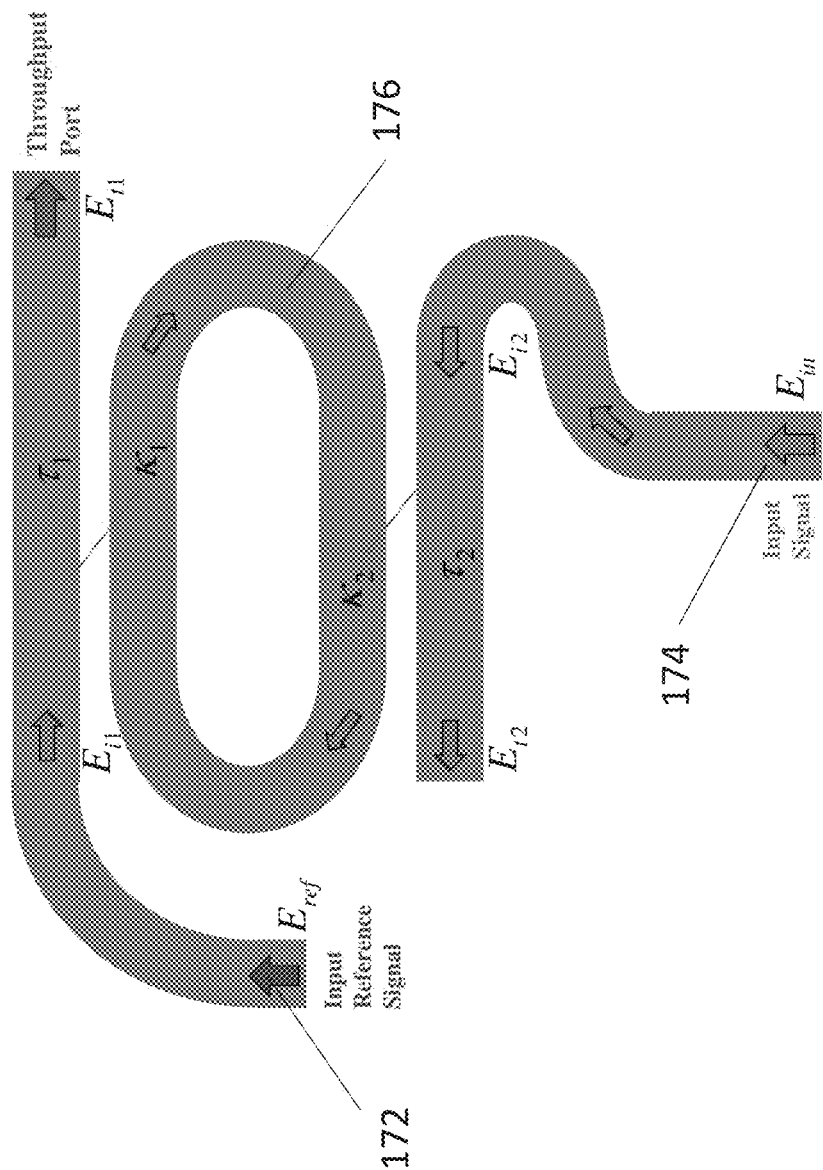
Figures 17B, 17C:
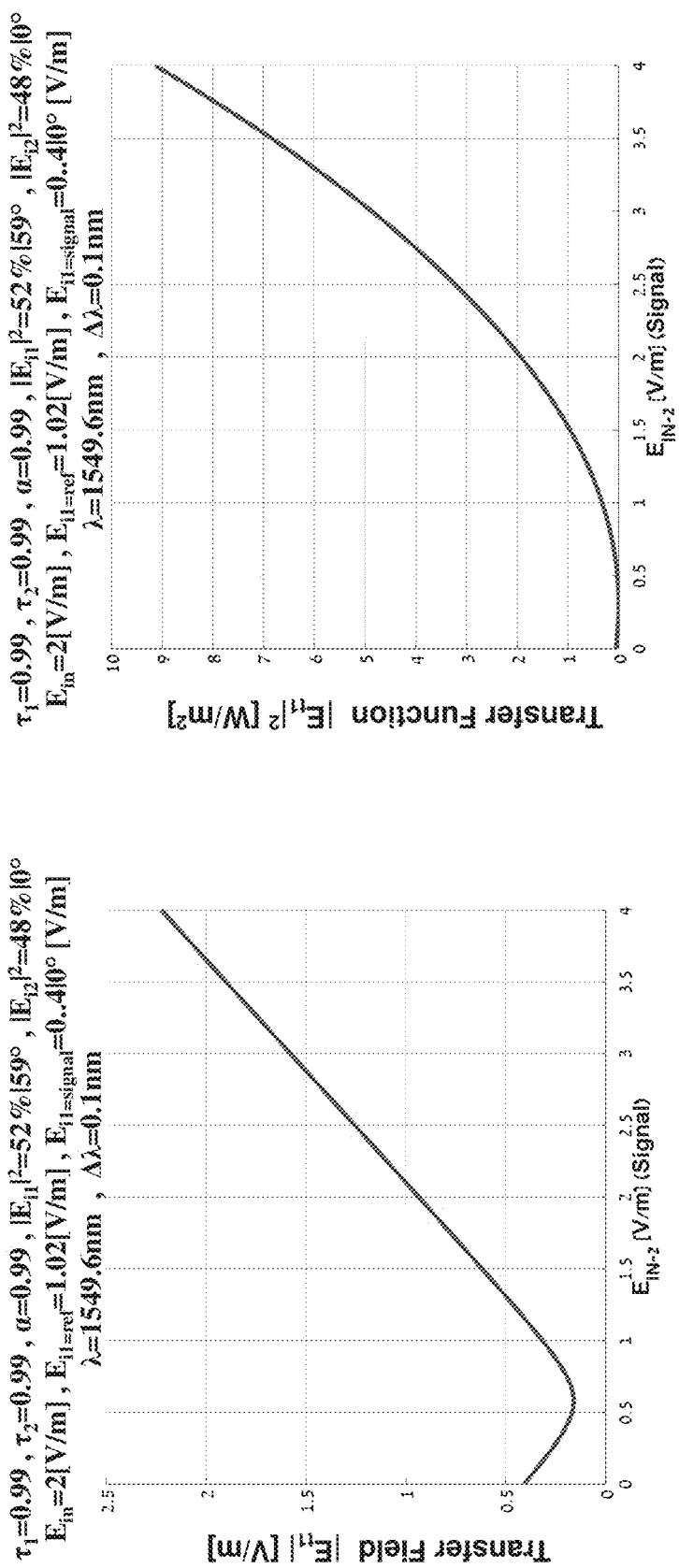

The two devices of FIGS. 16A and 17A may have different fabrication parameters. Each device receives an input optical signal, $E_{in}$, and a reference optical signal, $E_{ref}$. Also the optical inputs for $E_{in}$ and $E_{ref}$ are swapped in one device with respect to the other. Thus in device 170 in FIG. 17A, Input port 172 is the optical input for $E_{ref}$ and input port 174 is the optical input for $E_{in}$. Both are coupled to the racetrack resonator 176. Below each device are the optical field 16B and 17B and intensity 16C and 17C, at the throughput port, as a function of the phase of the "Input Signal" $E_{in}$.

Reference is now made to FIGS. 18A, 18B and 18C which illustrate an embodiment designed for phase detection. It is possible to detect the phase of the input signal (here: $E_{in} = E_{i1}$) and convert it to optical field or intensity. The DI device can be configured to provide the functionality shown in the present embodiment. The output signal magnitude (at the throughput port) is a function of the phase of the input signal $E_{in}$. Phase detection can be used at the receiver side to detect the phase of an incoming optical signal when using advanced transmission techniques, such as QAM, PSK and APSK. Specifically, a signal at port 180 and a reference signal at port 182 are injected to DI circuit 184. The ports are coupled to racetrack 186 and the output emerges at output port 188. The plots in FIGS. 18B and 18C show the field magnitude and intensity responses as a function of the phase or the input signal.

Reference is now made to FIGS. 19A-19F, which illustrate an embodiment encompassing response shape via optical power, that is to say a response shape that is governed by the reference (CONTROL) optical power. It is possible to obtain the different shapes shown in FIGS. 19B-F, and in particular switch between responses, by changing the input optical power injected to device 190 at the optical control line, $E_{control}$ 192. The input signal is injected at port 194 and both input and control lines are coupled to racetrack 196. The output emerges from throughput port 198. Thus, in device 190, the optical input at $E_{i2}$, serves as a signal input.

FIGS. 19B-19F indicate various responses of the DI resonator 190 that may be generated without modifying any parameters of the circuit expect the input power of the control line. In the figures, the X-axis represents the frequency of both input ports. Switching may be carried out between responses by suitable manipulation of the input power.

Reference is now made to FIGS. 20A-20C and FIGS. 21A-21C, which illustrate control of FSR Shape via optical power, that is via optical input power. In this example, moving between two FSRs is carried out using a different set of device parameters.

It is possible to move from one FSR state to another state by changing the power of the optical control line. In FIG. 20A, in device 200, the optical input 202 at $E_{i1}$ serves as the control line, and the optical input at 204 is the signal line. Both are coupled to the racetrack resonator 206 and the output emerges at throughput port 208. In FIG. 21A, in device 210, the optical input 212 at $E_{i2}$, serves as the control line and the optical input at 214 is the signal line. Both are coupled to the racetrack resonator 216 and the output emerges at throughput port 218. More particularly, FIG. 20A is a schematic description of inputting a signal and a control to the DI circuit to change between FSR states.

Figure 20B:
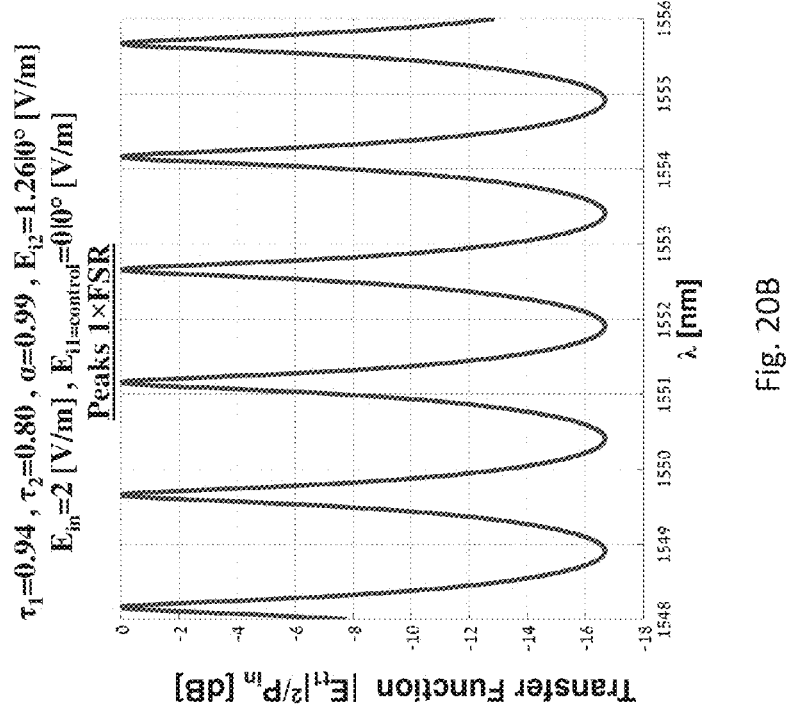
Figure 20A:
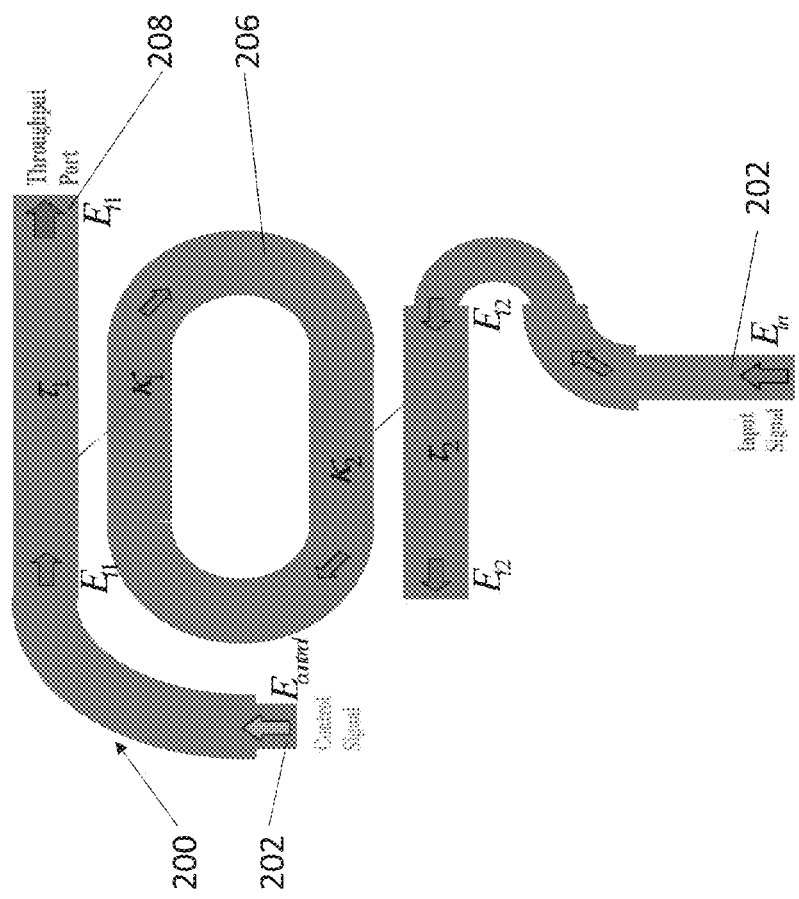
Figure 20C:
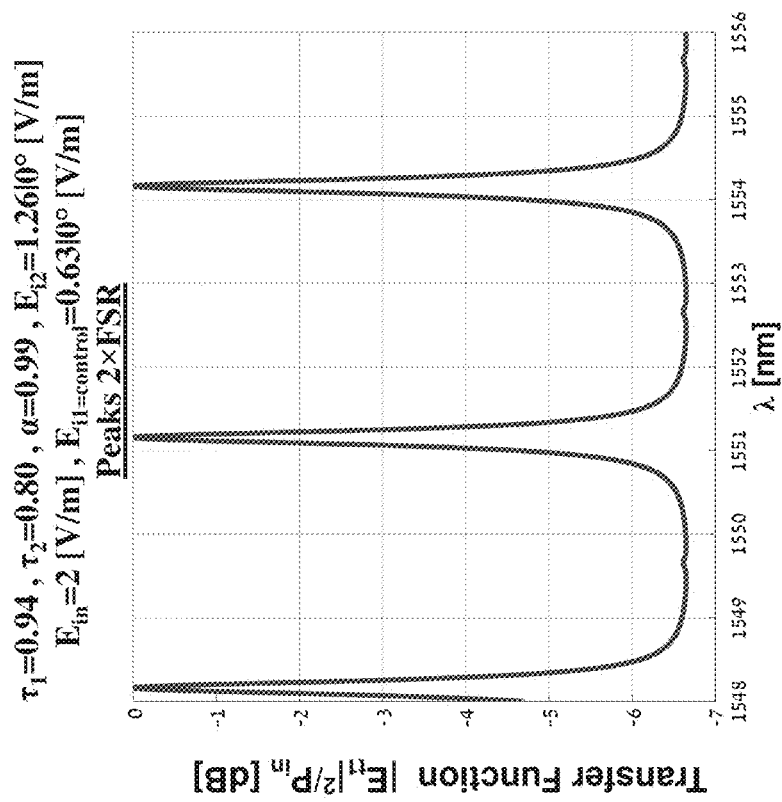
Figure 21B:
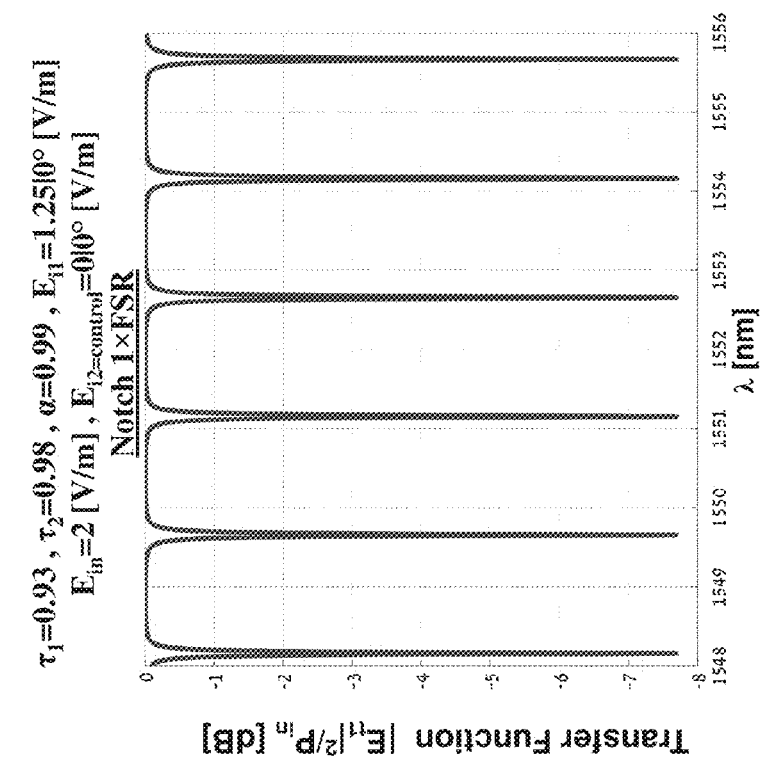
Figure 21A:
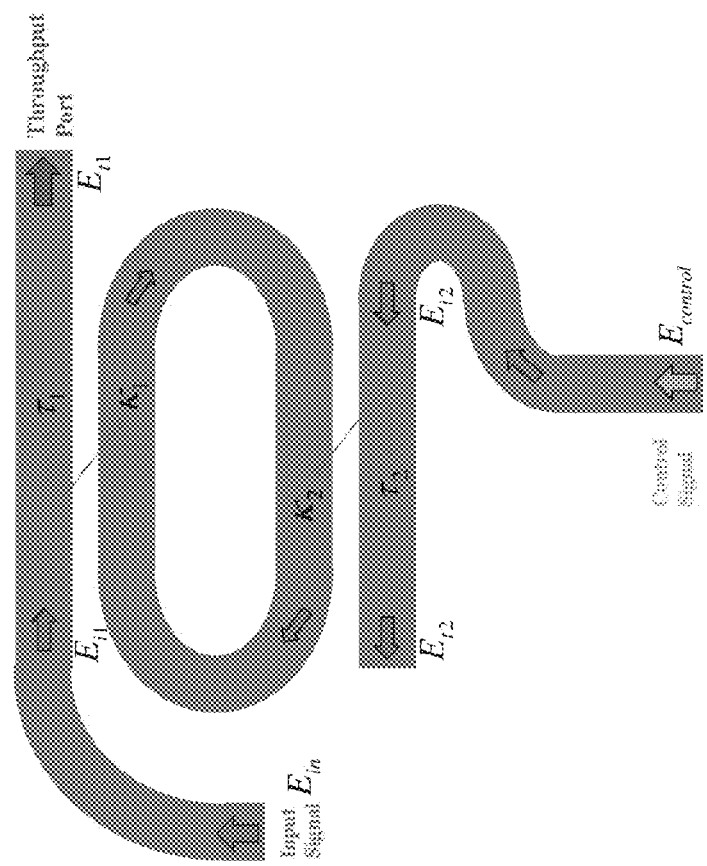
Figure 21C:
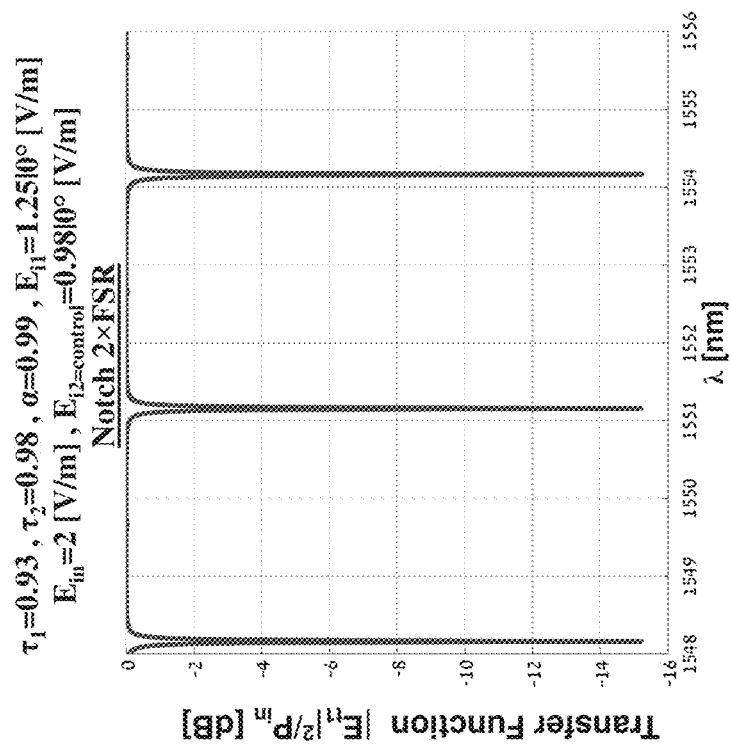

In FIGS. 20B-20C, the switching FSR state of the Peak response shapes is shown and in FIGS. 21B and 21C, the switching FSR state of the Notch response shape is shown.

Reference is now made to FIG. 22, which illustrates a further embodiment of the present invention in which optical coupling is used to provide a programmable matrix. In greater detail, the basic FLAME example discussed above in respect of FIG. 6 may be represented schematically as shown in FIG. 22 as have two optical inputs 220 and 222 and two optical outputs 224 and 226 connected via a function box 228 wherein the function box may operate as a programmable matrix array connecting the various inputs with the various outputs via function values which may be varied. That is to say the function box 228 may operate as a programmable matrix array. FIG. 22 shows how the structure in FIG. 6 may provide a 2×2 matrix array. However structures may be designed to implement any reasonable size of array, or, with reference now to FIG. 23, an array 230 may be provided using four of the FIG. 6 structure, P1 . . . P4, as a basic unit.

Thus, by using an array of the devices such as those in FIG. 6 one can provide a device capable of performing matrix-like operations on an incoming set of optical signals. The device may more generally have M optical inputs, and N optical outputs, N and M being arbitrary, the matrix entries being programmable so that the N optical outputs are some function of the M optical inputs.

Such a configuration may be used in applications such as: routing, switching, Butler matrix, etc.

When operated in the linear region, the relation between the device two optical inputs with relation to the two optical inputs can be formulated by a 2×2 matrix, P, of complex elements, whose specific values can be manipulated by control voltages applied to the different electrical electrodes.

Note that with the absence of electrical electrodes the matrix array can be pre-determined by design and the corresponding fabricated device will provide a fixed operation. Clearly, any of the electrodes can be eliminated if corresponding modulation\phase shift\coupling is not mandatory.

As shown in FIG. 23, a four port optical input 232 is connected to a four port optical output 234.

FIG. 23 employs four (2×2) FLAME devices, P1 . . . P4 for obtaining a 4×4 configurable matrix operation. The overall functionality of the array depicted in FIG. 23 can be described by a 4×4 matrix with complex entries as described below.

We denote by the vectors $\underline{x}$ and $\underline{y}$ the 4-input and 4-output optical signals (instantaneous amplitude and phase), respectively.

Let us denote by A the 4×4 matrix representing the two left-hand FLAME devices in FIG. 23. Clearly, this matrix is given by:

$$A = \begin{bmatrix} P1 & 0 \\ 0 & P2 \end{bmatrix};$$

Likewise, we may denote by B the 4×4 matrix representing the two right-hand FLAME devices:

$$B = \begin{bmatrix} P3 & 0 \\ 0 & P4 \end{bmatrix};$$

where 0 denotes a 2×2 null matrix.

Finally, let $\tilde{I}$ denote the interleaving operation that the 4 outputs from the left-hand matrix A undergo prior to entering the right-hand operation given by matrix B:

$$\tilde{I} = \begin{bmatrix} 1 & 0 & 0 & 0 \\ 0 & 0 & 1 & 0 \\ 0 & 1 & 0 & 0 \\ 0 & 0 & 0 & 1 \end{bmatrix},$$

where {0,1} are real numbers.

Consequently, the operation performed by the array given in FIG. 23 can be formulated as:

$$\underline{y} = B \cdot \tilde{I} \cdot A \cdot \underline{x}.$$

A further embodiment may use a triple-injection device as an alternative to the double injection device depicted in FIG. 6. FIG. 15 depicts a triple-injection device without electrodes. FIG. 24 herein shows a triple-injection device 240 with electrodes alongside an example array 242 of four triple-injection devices, 244. It is noted that the device may be implemented as a maximum 6×6 device, wherein 6 injections may be a maximum, and any number smaller than 6 can be used at input or/and output.

By proper selection of electrical control (voltages), an M×N matrix operation can be set to provide some desirable functionality, for example: one may set up a configurable permutation matrix for controlled routing; switching operations; butler matrix functionality and the like. A Butler matrix is a matrix used in an optical beamforming network to feed antenna elements of a phased array antenna. The main purpose of the matrix is to control the direction of the emitted beam. The matrix is a passive device containing fixed-value phase shifters which provide phase difference between elements in order to steer the beam in the desired direction. The implementation of control voltages in each element as seen in FIG. 6 would allow the option of actively programming the Butler matrix function, for example to overcome errors due to fabrication defects or the like.

A further embodiment relates to an artificial neural-network (ANN) implementation which uses a multiple-injection array.

Mimicking Biological neural networks (BNN) with electronic or photonic hardware is also called neuromorphic computing. Compared with the ANNs directly based on biological neural cells, indirect ANNs rely on electronic or photonic systems containing artificial neurons to indirectly mimic the neurobiological architectures of BNNs.

An ANN is a network consisting of a grid of interconnections, weighting, and activation functions, a.k.a. transfer functions. The execution of a task involves simultaneous activation of a large number of artificial neurons given a set of inputs from the other artificial neurons. The neurons of one layer may be connected into an artificial neuron of a following layer and the inputs are summed up to produce outputs (y) to the other neurons on axons. Many of the aforementioned ANN elements, including the interconnection array structure can be realized by an array of multiple-injection devices where the weightings of the connections may be set using the electrodes as above, so that the connections become matrix values as per the previous embodiment. The electrodes may be separately programmable so the learning on the different axons is independent of learning on other axons. The non-linear aspects of the Kerr effect may be useful here.

It is expected that during the life of a patent maturing from this application many relevant modulators and ring-type configurations will be developed and the scopes of the corresponding terms are intended to include all such new technologies a priori.

The terms "comprises", "comprising", "includes", "including", "having" and their conjugates mean "including but not limited to".

The term "consisting of" means "including and limited to".

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment, and the text is to be construed as if such a single embodiment is explicitly written out in detail. Conversely, various features of the invention, which are, for brevity, described in the context of a single embodiment, may also be provided separately or in any suitable subcombination or as suitable in any other described embodiment of the invention, and the text is to be construed as if such separate embodiments or subcombinations are explicitly set forth herein in detail.

Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. An optical response shaper and/or a modulator device with multiple injection, the device comprising:
   a resonator having an enclosed geometric structure;
   a first injection optical waveguide and at least one further injection optical waveguides, each of said optical waveguides comprising an input port and a second end, the optical waveguides passing the resonator at respective approach points;
   coupling regions between said resonator and said injecting waveguides at said approach points respectively, the coupling regions providing optical coupling between said resonator and said injecting waveguides; and
   an output port at a second end of said first injection optical waveguide configured to provide a plurality of shapes of frequency or time or phase or intensity responses according to parameters of said injecting waveguides or of said coupling regions and further according to a power of an optical control signal injected at said at least one further optical waveguide;
   at least two input ports;
   at least two output ports; and
   electrodes at ones of said coupling regions, said electrodes each being configured to separately vary a respective coupling coefficient, thereby to provide a programmable matrix function.

2. The optical response shaper of claim 1, parameters of the coupling regions or the waveguides defining at least two Free Spectral Range states, wherein said at least two free spectral range states comprise a first, regular, state and at least one additional, larger period state.

3. The optical response shaper of claim 1, wherein at least one of said two coupling regions is configured with a coupling coefficient selected for said predetermined frequency or time or phase response.

4. The device of claim 3, further comprising at least one electrode placed at the vicinity of at least one of said waveguides, said additional electrode being for programmably altering a respective coupling coefficient to vary said predetermined frequency response or time response or phase-response.

5. The device of claim 4, comprising an electrode over each coupling region respectively, thereby to alter coupling coefficients at each coupling region.

6. The device of claim 1, connected to at least three other devices according to claim 1, thereby to form a programmable optical matrix array, or to form an artificial neural network, wherein said separately programmable electrodes provide axons for network learning, or to form a multiple input multiple output programmable matrix, or to form a grid.

7. The device of claim 1, wherein a length along a first of said injection waveguides from a respective input port to a respective coupling region is different from a length of a second of said injection waveguides from a respective input port to a respective coupling region, or wherein the enclosed geometric structure comprises a ring structure or a racetrack structure, or a disk structure or a Fabry-Perot type structure, or a photonic crystal-based structure, or a structure forming an optical resonator.

8. The device of claim 1, comprising a separately programmable electrode over each of said coupling regions respectively, the separately programmable electrode comprising one member of the group comprising a PN diode, PIN diode, MOS capacitor, a BJT transistor, an electrode that uses thermo-optic effect, and an electrode that uses the electro-optic effect, or an electrode that uses a plasmonic effect, or an electrode that uses a stress induced effect.

9. The device of claim 1, wherein said predetermined response is one member of the group consisting of sinusoidal, triangular, square, combined dips and peaks, spikes, an interleaver, a fano-spectrum shape and a Parameters-Insensitive-Response.

10. The device of claim 1 wherein said coupling coefficient is at least partly governed by a distance between said resonator and a respective waveguide or by the said waveguides' width, at a respective coupling region.

11. The device of claim 1, configured to provide a constellation of points for quadrature amplitude modulation (QAM) or one member of the group of modulations consisting of: Phase Shift Keying (PSK), Pulse Amplitude Modulation (PAM), Quadrature Amplitude Modulation (QAM) and Amplitude, FSR shaping and Phase Shift Keying (APSK).

12. The device of claim 1, wherein said time or frequency or phase response is affected by an optical input power.

13. An optical response shaper and/or a modulator device with multiple injection, the device comprising:
a resonator having an enclosed geometric structure;
at least two injection optical waveguides between an input port and a second end, the optical waveguides passing the resonator at respective approach points;
coupling regions between said resonator and said injecting waveguides at said approach points respectively, the coupling regions providing optical coupling between said resonator and said injecting waveguides;
electrodes in proximity to each of said waveguides, and
an output port at a second end of one of said injection optical waveguides, said device being configured to vary voltages at said electrodes respectively, thereby to provide variations in shapes or frequency or time or phase or intensity at said output wherein the electrodes are configured to vary said voltages to provide FSR shaping.

14. The device of claim 13, wherein said electrodes in proximity to said waveguides are located at said coupling regions respectively.

15. An optical response shaper and/or a modulator device with multiple injection, the device comprising:
a resonator having an enclosed geometric structure;
at least two injection optical waveguides between an input port and a second end, the optical waveguides passing the resonator at respective approach points;
coupling regions between said resonator and said injecting waveguides at said approach points respectively, the coupling regions providing optical coupling between said resonator and said injecting waveguides;
electrodes in proximity to each of said waveguides, and
an output port at a second end of one of said injection optical waveguides, said device being configured to vary voltages at said electrodes respectively, thereby to provide variations in shapes or frequency or time or phase or intensity at said output, wherein at least one of said coupling regions is offset from a location half way round said resonator from a second of said coupling regions.

16. The optical response shaper of claim 13, parameters of the coupling regions or the waveguides defining at least two Free Spectral Range states, wherein said at least two free spectral range states comprise a first, regular, state and at least one additional, larger period state.

17. The optical response shaper of claim 13, wherein at least one of said two coupling regions is configured with a coupling coefficient selected for said predetermined frequency or time or phase response.

18. The device of claim 17, further comprising at least one electrode placed at the vicinity of at least one of said waveguides, said additional electrode being for programmably altering a respective coupling coefficient to vary said predetermined frequency response or time response or phase-response.

19. The device of claim 17, comprising an electrode over each coupling region respectively, thereby to alter coupling coefficients at each coupling region.

20. The device of claim 13, comprising at least two input ports and at least two output ports and electrodes at each coupling region, said electrodes each being configured to separately vary a respective coupling coefficient, thereby to provide a programmable matrix function.

21. The device of claim 13, wherein a length along a first of said injection waveguides from a respective input port to a respective coupling region is different from a length of a second of said injection waveguides from a respective input port to a respective coupling region.

22. The device of claim 13, wherein said coupling coefficient is at least partly governed by a distance between said resonator and a respective waveguide or by the said waveguides' width, at a respective coupling region.

* * * * *